US012745350B2

(12) United States Patent
Tazzoli

(10) Patent No.: US 12,745,350 B2
(45) Date of Patent: Sep. 22, 2026

(54) TRANSMITTER CHARGING MODULE FOR LIGHT DETECTION AND RANGING (LIDAR) DEVICE

(71) Applicant: Waymo LLC, Mountain View, CA (US)

(72) Inventor: Augusto Tazzoli, San Jose, CA (US)

(73) Assignee: Waymo LLC, Mountain View, CA (US)

( * ) Notice: Subject to any disclaimer, the term of this patent is extended or adjusted under 35 U.S.C. 154(b) by 945 days.

(21) Appl. No.: 18/069,770

(22) Filed: Dec. 21, 2022

(65) Prior Publication Data

US 2024/0215169 A1 Jun. 27, 2024

(51) Int. Cl.
*H05K 1/181* (2026.01)
*G01S 7/481* (2006.01)
(Continued)

(52) U.S. Cl.
CPC ............ *H05K 1/181* (2013.01); *G01S 7/4814* (2013.01); *G01S 7/484* (2013.01); *G01S 17/931* (2020.01);
(Continued)

(58) Field of Classification Search
CPC .................. H05K 1/181; H05K 1/115; H05K 2201/10287; H05K 2201/10674; G01S 17/931; G01S 7/4814; G01S 7/484
(Continued)

(56) References Cited

U.S. PATENT DOCUMENTS 7,969,558 B2 6/2011 Hall
9,285,464 B2 3/2016 Pennecot et al.
(Continued)

FOREIGN PATENT DOCUMENTS

CN 210668517 U 6/2020
CN 114594453 A 6/2022
(Continued)

OTHER PUBLICATIONS

STMicroelectronics, L9822N: Octal Serial Solenoid Driver (Year: 2003).*
(Continued)

*Primary Examiner* — Helal A Algahaim
*Assistant Examiner* — James W. Napier
(74) *Attorney, Agent, or Firm* — McDonnell Boehnen Hulbert & Berghoff LLP

(57) ABSTRACT

Example embodiments relate to transmitter charging modules for light detection and ranging (lidar) devices. An example embodiment includes a method. The method includes receiving, from a controller, an indication of a first set of light emitters to be fired during a firing cycle. The first set of light emitters is a subset of a plurality of light emitters of the lidar device. The method also includes selectively charging, by a charging circuit of the lidar device during a charging cycle, a first set of energy storage devices of the lidar device. Additionally, the method includes refraining from charging, by the charging circuit of the lidar device during the charging cycle, each energy storage device in the plurality of energy storage devices that is not in the first set of energy storage devices. Further, the method includes emitting light signals from the first set of light emitters during the firing cycle.

20 Claims, 24 Drawing Sheets

(51) Int. Cl.
*G01S 7/484* (2006.01)
*G01S 17/931* (2020.01)
*H05K 1/11* (2006.01)

(52) U.S. Cl.
CPC ... *H05K 1/115* (2013.01); *H05K 2201/10287* (2013.01); *H05K 2201/10674* (2013.01)

(58) Field of Classification Search
USPC .......................................................... 356/4.01
See application file for complete search history.

(56) References Cited

U.S. PATENT DOCUMENTS

| | | | | |
|---|---|---|---|---|
| 9,368,936 | B1 * | 6/2016 | Lenius | G01S 7/484 |
| 10,359,507 | B2 | 7/2019 | Berger et al. | |
| 10,983,197 | B1 * | 4/2021 | Zhu | G01S 7/497 |
| 11,064,604 | B1 * | 7/2021 | Goldin | H01M 50/238 |
| 11,172,605 | B2 | 11/2021 | Hahn et al. | |
| 2013/0113601 | A1 | 5/2013 | San Luis et al. | |
| 2016/0211079 | A1 | 7/2016 | Armstrong et al. | |
| 2019/0011567 | A1 * | 1/2019 | Pacala | G01S 7/4815 |
| 2019/0250257 | A1 | 8/2019 | Finkelstein et al. | |
| 2020/0120813 | A1 * | 4/2020 | Dunford | H05K 3/1283 |
| 2020/0205250 | A1 * | 6/2020 | Lu | G01S 7/484 |
| 2021/0173047 | A1 | 6/2021 | Droz et al. | |
| 2021/0199762 | A1 | 7/2021 | Jones et al. | |
| 2024/0201341 | A1 * | 6/2024 | Siessegger | G01S 7/484 |

FOREIGN PATENT DOCUMENTS

| | | | | |
|---|---|---|---|---|
| CN | 217278913 | U | 8/2022 | |
| DE | 102021101584 | B3 | 3/2022 | |
| EP | 3855585 | A1 * | 7/2021 | H03K 3/02 |
| EP | 3859393 | A1 * | 8/2021 | H01S 5/042 |
| WO | WO-2018125823 | A1 * | 7/2018 | G01S 7/4815 |
| WO | 2021140160 | A1 | 7/2021 | |
| WO | 2022094254 | A1 | 5/2022 | |

OTHER PUBLICATIONS

Advantages of Mezzanine PCBs (Year: 2014).*

“2.5D Technology Platform—The New Dimension”, Austria Technologie & Systemtechnik Aktiengesellschaft, www.ats.net, 19 pages.

“36V, 1A Octal Integrated Serial-Controlled Solenoid and Motor Driver”, MAX22200, Maxim Integrated, 19-100531; Rev. 0; Apr. 2020, retrieved from www.maximintegrated.com, 45 pages.

Felix, Faith, Rodrick S. Swai, Mussa Ally Dida, and Ramadhani Sinde. “Development of Navigation System for Blind People based on Light Detection and Ranging Technology (LiDAR).” Development (2022).

Pending U.S. Appl. No. 17/821,535, filed Aug. 23, 2022.

* cited by examiner 822
812
814
816
818
898
896
898
894

822
898
894
896
898

TRANSMITTER CHARGING MODULE FOR LIGHT DETECTION AND RANGING (LIDAR) DEVICE

BACKGROUND

Unless otherwise indicated herein, the description in this section is not prior art to the claims in this application and is not admitted to be prior art by inclusion in this section.

A light detection and ranging (lidar) device can determine distances to environmental features while scanning a scene. Those distances can then be assembled into a "point cloud" (or other type of representation) indicative of surfaces in the surrounding environment. Individual points in the point cloud can be determined, for example, by transmitting a laser pulse and detecting a returning pulse, if any, reflected from an object in the surrounding environment, and then determining a distance to the object according to a time delay between the transmission of the pulse and the reception of the reflected pulse. The resulting point cloud, for example, may correspond to a three-dimensional map of points indicative of locations of reflective features in the surrounding environment.

SUMMARY

Example embodiments relate to transmitter modules for light detection and ranging (lidar) devices. In particular, embodiments relate to firing circuits and light emitters for lidar devices. The firing circuits may include a charging circuit portion and a pulser circuit portion. The charging circuit may charge energy storage devices that are later discharged through the light emitters using the pulser circuit in order to cause the light emitters to emit light. In some cases, the charging circuits may charge a certain subset of the energy storage devices while refraining from charging other energy storage devices. By doing so, the light emitters that emit light during a given firing cycle may be selected (e.g., only those light emitters that correspond to charged energy storage devices may emit light during the firing cycle). In addition to the circuit layout involved in the firing circuits, embodiments herein may also provide for the physical layout of the firing circuit (e.g., of the charging circuit and/or the pulser circuit). For example, the charging circuit may be distributed across a plurality of printed circuit board (PCB) surfaces (e.g., the PCB surfaces, themselves, being distributed across a plurality of PCBs). In some embodiments, this may involve vertically stacking a number of PCB surfaces, forming a recession in one or more PCB surfaces, and/or bending one or more PCBs.

In a first aspect, a method is provided. The method includes receiving, from a controller of a light detection and ranging (lidar) device, an indication of a first set of light emitters to be fired during a firing cycle. The first set of light emitters is a subset of a plurality of light emitters of the lidar device such that the plurality of light emitters includes one or more light emitters that are not in the first set of light emitters. The method also includes selectively charging, by a charging circuit of the lidar device during a charging cycle, a first set of energy storage devices of the lidar device. The first set of energy storage devices is a subset of a plurality of energy storage devices of the lidar device such that the plurality of energy storage devices includes one or more energy storage devices that are not in the first set of energy storage devices. Each energy storage device of the first set of energy storage devices is associated with a light emitter in the first set of light emitters. Additionally, the method includes refraining from charging, by the charging circuit of the lidar device during the charging cycle, each energy storage device in the plurality of energy storage devices that is not in the first set of energy storage devices. Further, the method includes emitting light signals from the first set of light emitters during the firing cycle. Emitting light signals from the first set of light emitters during the firing cycle includes discharging, by a pulser circuit, energy stored within each of the energy storage devices in the first set of energy storage devices through the associated light emitter in the first set of light emitters.

In a second aspect, a light detection and ranging (lidar) device is provided. The lidar device includes a controller. The lidar device also includes a plurality of light emitters. Additionally, the lidar device includes a charging circuit that includes a plurality of energy storage devices. Further, the lidar device includes a pulser circuit. The charging circuit is configured to receive an indication of a first set of light emitters to be fired during a firing cycle. The first set of light emitters is a subset of the plurality of light emitters such that the plurality of light emitters includes one or more light emitters that are not in the first set of light emitters. The charging circuit is configured to selectively charge, during a charging cycle, a first set of energy storage devices. The first set of energy storage devices is a subset of the plurality of energy storage devices such that the plurality of energy storage devices includes one or more energy storage devices that are not in the first set of energy storage devices. Each energy storage device of the first set of energy storage devices is associated with a light emitter in the first set of light emitters. The charging circuit is configured to refrain from charging, during the charging cycle, each energy storage device in the plurality of energy storage devices that is not in the first set of energy storage devices. The pulser circuit is configured to discharge energy stored within each of the energy storage devices in the first set of energy storage devices through the associated light emitter in the first set of light emitters in order to cause the first set of light emitters to emit light signals during the firing cycle.

In a third aspect, a light detection and ranging (lidar) device is provided. The lidar device includes a controller. The lidar device also includes a plurality of light emitters. Additionally, the lidar device includes a charging circuit that includes a plurality of energy storage devices. Further, the lidar device includes a pulser circuit. The charging circuit is configured to receive an indication of a first set of light emitters to be fired during a firing cycle. The first set of light emitters is a subset of the plurality of light emitters such that the plurality of light emitters includes one or more light emitters that are not in the first set of light emitters. The charging circuit is configured to selectively charge, during a charging cycle, a first set of energy storage devices. The first set of energy storage devices is a subset of the plurality of energy storage devices such that the plurality of energy storage devices includes one or more energy storage devices that are not in the first set of energy storage devices. Each energy storage device of the first set of energy storage devices is associated with a light emitter in the first set of light emitters. The charging circuit is configured to refrain from charging, during the charging cycle, each energy storage device in the plurality of energy storage devices that is not in the first set of energy storage devices. The pulser circuit is configured to discharge energy stored within each of the energy storage devices in the first set of energy storage devices through the associated light emitter in the first set of light emitters in order to cause the first set of light emitters to emit light signals during the firing cycle. In addition, the lidar device includes a plurality of light detectors configured to detect reflections of the light signals emitted by the first set of light emitters during the firing cycle.

These as well as other aspects, advantages, and alternatives will become apparent to those of ordinary skill in the art by reading the following detailed description, with reference, where appropriate, to the accompanying drawings.

DETAILED DESCRIPTION

Figure 1:
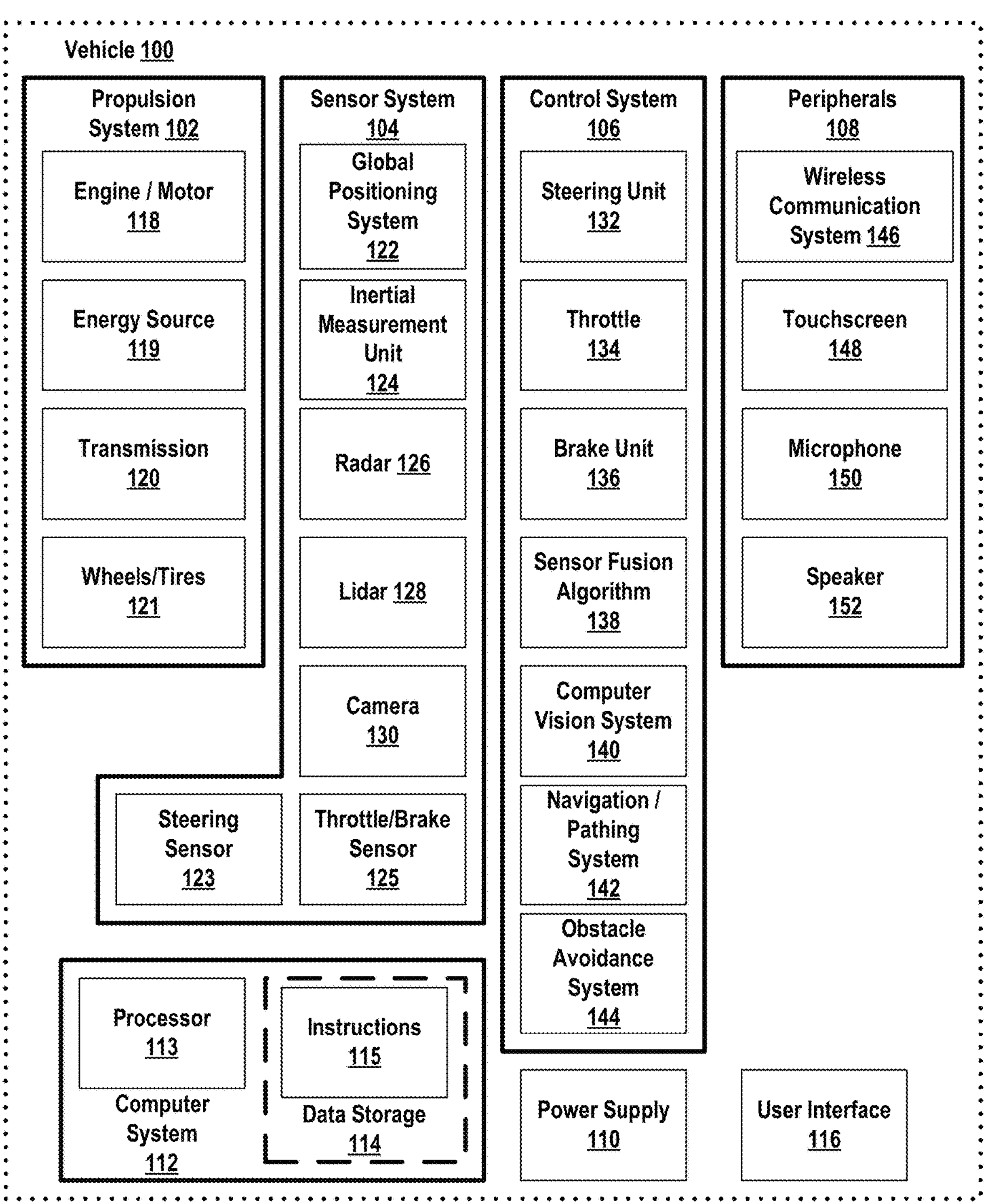
FIG. 1 is a functional block diagram illustrating a vehicle, according to example embodiments.

Example methods and systems are contemplated herein. Any example embodiment or feature described herein is not necessarily to be construed as preferred or advantageous over other embodiments or features. Further, the example embodiments described herein are not meant to be limiting. It will be readily understood that certain aspects of the disclosed systems and methods can be arranged and combined in a wide variety of different configurations, all of which are contemplated herein. In addition, the particular arrangements shown in the figures should not be viewed as limiting. It should be understood that other embodiments might include more or less of each element shown in a given figure. Additionally, some of the illustrated elements may be combined or omitted. Yet further, an example embodiment may include elements that are not illustrated in the figures.

Lidar devices as described herein can include one or more light emitters and one or more detectors used for detecting light that is emitted by the one or more light emitters and reflected by one or more objects in an environment surrounding the lidar device. As an example, the surrounding environment could include an interior or exterior environment, such as an inside of a building or an outside of a building. Additionally or alternatively, the surrounding environment could include an interior of a vehicle. Still further, the surrounding environment could include a vicinity around and/or on a roadway. Examples of objects in the surrounding environment include, but are not limited to, other vehicles, traffic signs, pedestrians, bicyclists, roadway surfaces, buildings, and terrain. Additionally, the one or more light emitters could emit light into a local environment of the lidar itself. For example, light emitted from the one or more light emitters could interact with a housing of the lidar and/or surfaces or structures coupled to the lidar. In some cases, the lidar could be mounted to a vehicle, in which case the one or more light emitters could be configured to emit light that interacts with objects within a vicinity of the vehicle. Further, the light emitters could include optical fiber amplifiers, laser diodes, light-emitting diodes (LEDs), among other possibilities.

In example embodiments, lidar devices may include one or more light emitters (e.g., laser diodes) and one or more light detectors (e.g., silicon photomultipliers (SiPMs), single-photon avalanche diodes (SPADs), avalanche photodiodes (APDs), etc.). For example, a lidar device may include an array of channels, which includes light emitters and corresponding light detectors. Such arrays may illuminate objects in the scene and receive reflected light from objects in the scene so as to collect data that may be used to generate a point cloud for a particular angular field of view relative to the lidar device. Further, to generate a point cloud with an enhanced field of view (e.g., a complete 360° field of view), the array of light emitters and the corresponding array of light detectors may send and receive light at predetermined times and/or locations within that enhanced field of view. For example, the lidar device may include an array of channels arranged around the vertical axis such that light is transmitted and received in multiple directions around the 360° field of view simultaneously. As another example, a lidar device may scan (e.g., be rotated or use other mechanisms to beam scan) about a central axis to transmit/receive multiple sets of data. The data can be used to form point clouds that can be composited to generate the enhanced field of view.

In order to emit light from the light emitter(s), a lidar device as described herein may include one or more firing circuits that are electrically coupled to the light emitter(s). Such firing circuits may receive (e.g., at a processor, such as a field-programmable gate array (FPGA) of the firing circuit, via a serial peripheral interface (SPI)) one or more control signals from a lidar controller that indicate to the firing circuit which channel(s) (i.e., which light emitter(s)) within the lidar device are to be fired during a subsequent firing cycle. Upon receiving the control signal(s), the firing circuit may then cause the indicated light emitter(s) to fire during a future firing cycle. In some embodiments, based on the received control signal(s) and during the firing cycle, the firing circuit may charge a series of energy storage devices (e.g., capacitors) and then, subsequently, use the energy stored in the charged energy storage devices to power corresponding light emitter(s) (e.g., laser diodes) in order to cause those corresponding light emitter(s) to emit light (e.g., energy stored within charged capacitors may be discharged through laser diodes to emit light signals).

In some embodiments, the firing circuit(s) described above may include one or more charging circuits (e.g., used to charge energy storage devices) and/or one or more pulser circuits (e.g., used to discharge energy storage devices in order to power the light emitter(s)). As used herein, "charging circuits" may provide energy to one or more energy storage devices or to one or more light emitters, themselves. The energy provided by a "charging circuit" may ultimately be usable to cause a corresponding light emitter to emit light (e.g., presuming that the energy was not prematurely discharged to prevent the light emitter from emitting light). As such, "charging circuits" may be usable to control emission intensities of light signals emitted by one or more light emitters (e.g., by controlling the amount of energy provided to the one or more energy storage devices). "Pulser circuits," on the other hand, may be used to allow energy (e.g., as stored in an energy storage device as a result of charging from a "charging circuit") to interact with the light emitter(s). For example, a "pulser circuit" may connect charged energy storage devices to the light emitter(s) and/or may connect the light emitter(s) and/or charged energy storage devices to ground in order to complete a circuit. Such connections may be made using resistors or transistors with variable resistances, for example. Alternatively, "pulser circuits" may provide a trigger signal to one or more light emitters. Regardless of the implementation, "pulser circuits" may control when one or more light emitters emit light. Further, in some embodiments, "pulser circuits" may control the emission intensity (e.g., emission waveform) of light signals emitted by one or more light emitters (e.g., by adjusting a variable resistance).

Various embodiments and arrangements of charging circuits and firing circuits are disclosed herein. For example, charging circuits may include one energy storage device (e.g., a multi-layer ceramic capacitor (MLCC) or a silicon capacitor, such as an MLCC or a silicon capacitor having a capacitance between 0.1 nF and 10 nF) corresponding to each of the light emitters in the lidar device. These energy storage devices may be connected to the anodes of their respective light emitters (e.g., laser diodes). In addition, the cathodes of the light emitters may be switchably connected to ground via one or more electrical switches (e.g., field-effect transistors (FETs) of a pulser circuit) during a firing period (e.g., in order to form a complete circuit so as to discharge energy stored within the energy storage devices through the laser diodes, thereby causing the laser diodes to emit light signals). Further, the charging circuits disclosed herein may include an arrangement of circuit components (e.g., arranged in the form of an application-specific integrated circuit (ASIC)) capable of individually charging or refraining from charging each of the energy storage devices during each charging cycle/firing cycle. Some advantages to such operations may include increased efficiency. For example, in some cases, such as to avoid shooting a retroreflector with a light signal, the charging circuit may refrain from charging a capacitor associated with a laser diode such that the laser diode does not emit light during a firing cycle. By refraining from charging one or more of the capacitors associated with one or more light emitters that are not intended to emit light during a firing cycle, less energy can be wasted during the charging cycle (e.g., when compared with an alternative where all capacitors are charged and then those that are not intended to be used are prematurely discharged prior to the firing cycle).

Charging circuits as described herein may also allow for emitting light signals from the light emitter(s) according to a time-domain multiple access (TDMA) modulation technique. As an example, the TDMA modulation could be performed using an array of high-side switches (e.g., a solenoid driver, such as an octal solenoid driver; a serial-controlled solenoid driver; an integrated serial-controlled solenoid driver; a metal-oxide-semiconductor field-effect transistor (MOSFET) driver; an H-bridge driver; a motor driver; a light-emitting diode (LED) driver; a multiplexer; or a plurality of load switches), which could include digital logic circuitry that is configured to charge and/or discharge multiple energy storage devices in parallel. In another example embodiment, the operations could include charging energy storage devices corresponding to and thereafter emitting light signals from a first group of four light emitters in a first firing period. Then, in a subsequent firing period, the operations could include charging energy storage devices corresponding to and thereafter emitting light signals from a second group of four light emitters. In various examples, the frequency of light signal emissions from various light emitters(s) across a firing cycle could be between 1 kHz and 500 kHz. Further, in some examples, the frequency of light signal emissions from various light emitters(s) across a firing signal may be greater than 500 kHz (e.g., depending upon the charging time used for charging the energy storage devices).

In some embodiments, after charging the energy storage devices (e.g., silicon capacitors) corresponding to those light emitters that are to be fired during the firing cycle, the firing cycle may commence. During the firing cycle, the light emitters (e.g., laser diodes) corresponding to the charged energy storage devices may be fired by selectively discharging the energy stored in the charged energy storage devices through the light emitters using a pulser circuit. This may occur by electrically coupling the cathode(s) of the laser diode(s) to ground using a gallium nitride field-effect transistor (GaNFET) (e.g., one GaNFET per channel/per laser diode or one GaNFET per group of channels/per laser diode) of the pulser circuit. For example, each of the laser diodes could be jointly electrically coupled to a common ground via a single GaNFET connected to a common cathode of the laser diodes. During the firing cycle, the emission power (e.g., peak power, average power, and/or power emission waveform) of the light signals emitted by each of the light emitters may be independently controlled. For example, the emission power of each of the light signals may be based on: the storage capacity (e.g., capacitance) of the energy storage device of the respective channel associated with the light emitter, the charging time used to charge the energy storage device of the respective channel associated with the light emitter, the charging voltage used to charge the energy storage device of the respective channel associated with the light emitter, and/or the emission time used to discharge energy from the energy storage device in the respective channel associated with the light emitter.

The charging circuit and pulser circuit described above may be electrically connected to one another and/or electrically connected to the light emitter(s). Further, in some embodiments, a charging circuit and a pulser circuit (jointly referred to as a "firing circuit") and/or corresponding light emitter(s) may be integrated into a light detection and ranging (lidar) device. In order to most efficiently occupy the spatial volume allocated for the firing circuit and the light emitter(s) within the lidar device and/or in order to reduce the amount of surface area required to implement the firing circuit/light emitter(s) within the lidar device, numerous possible physical arrangements and associated fabrication techniques of the firing circuit/light emitter(s) are described herein.

For example, the various components could be arranged along various substrates and stacked/hybridized. For instance, a first portion of the firing circuit could be arranged along a first substrate (e.g., first surface of a printed circuit board (PCB)) and a second portion of the firing circuit could be arranged along a second substrate (e.g., second surface of a PCB), which could be hybridized by way of a ball grid assembly (BGA), PCB 2.5D, wirebonding, etc. In an example, a processor (e.g., an FPGA, an ASIC, or a microprocessor) and a GaNFET could be positioned along the first substrate and corresponding inductors and capacitors could be arranged along the second substrate. Electrical connections could be made by way of through-wafer vias (TWV) or by way of wire bonds or ball grids. In some embodiments, an underfill material could be added between the substrates to provide enhanced thermal efficiency, enhanced thermal expansion behavior, enhanced mechanical strength, and/or electrical/RF isolation between the multiple substrates.

In still other embodiments, multiple PCBs or PCB surfaces may be stacked vertically adjacent to one another. For example, the charging circuit may be arranged across a first PCB surface and a second PCB surface. The first PCB surface may be located within a recession formed within a PCB and the second PCB surface may be located outside of the recession formed within the PCB. Further, components of the charging circuit may be electrically interconnected between the first PCB surface and the second PCB surface using wirebonds on the first PCB surface or the second PCB surface and vias through the PCB.

In yet other embodiments, the charging circuit may be arranged across multiple PCBs. For example, the charging circuit may be arranged across a first PCB and a second PCB. For instance, the first PCB may be flip-chip bonded to the second PCB. Further, the flip-chip bond may occur, at least in part, due to soldered connections (i) between a first side of a surface-mount technology (SMT) component and the first PCB surface and (ii) between a second side of the SMT component and the second PCB surface. In addition, components of the charging circuit may be electrically interconnected between the first PCB surface and the second PCB surface through the soldered connections.

Further, each charging circuit and/or each pulser circuit could be individually tested and/or packaged prior to hybridization with other portions of the firing circuit/lidar device. For example, the laser diode and/or an associated GaNFET could be provided in an individual diced package that could undergo electrical/optical/other characterization prior to hybridization (e.g., gluing) onto a substrate with the charging circuit. In some examples, the individualized laser diode/GaNFET package could be provided on a very thin substrate, such as a thin (~25 μm) ceramic substrate configured to be flexible and potentially height-controlled.

The following description and accompanying drawings will elucidate features of various example embodiments. The embodiments provided are by way of example, and are not intended to be limiting. As such, the dimensions of the drawings are not necessarily to scale.

Example systems within the scope of the present disclosure will now be described in greater detail. An example system may be implemented in or may take the form of an automobile. Additionally, an example system may also be implemented in or take the form of various vehicles, such as cars, trucks (e.g., pickup trucks, vans, tractors, and tractor trailers), motorcycles, buses, airplanes, helicopters, drones, lawn mowers, earth movers, boats, submarines, all-terrain vehicles, snowmobiles, aircraft, recreational vehicles, amusement park vehicles, farm equipment or vehicles, construction equipment or vehicles, warehouse equipment or vehicles, factory equipment or vehicles, trams, golf carts, trains, trolleys, sidewalk delivery vehicles, and robot devices. Other vehicles are possible as well. Further, in some embodiments, example systems might not include a vehicle.

Referring now to the figures, FIG. 1 is a functional block diagram illustrating example vehicle 100, which may be configured to operate fully or partially in an autonomous mode. More specifically, vehicle 100 may operate in an autonomous mode without human interaction through receiving control instructions from a computing system. As part of operating in the autonomous mode, vehicle 100 may use sensors to detect and possibly identify objects of the surrounding environment to enable safe navigation. Additionally, example vehicle 100 may operate in a partially autonomous (i.e., semi-autonomous) mode in which some functions of the vehicle 100 are controlled by a human driver of the vehicle 100 and some functions of the vehicle 100 are controlled by the computing system. For example, vehicle 100 may also include subsystems that enable the driver to control operations of vehicle 100 such as steering, acceleration, and braking, while the computing system performs assistive functions such as lane-departure warnings/lane-keeping assist or adaptive cruise control based on other objects (e.g., vehicles) in the surrounding environment.

As described herein, in a partially autonomous driving mode, even though the vehicle assists with one or more driving operations (e.g., steering, braking and/or accelerating to perform lane centering, adaptive cruise control, advanced driver assistance systems (ADAS), and emergency braking), the human driver is expected to be situationally aware of the vehicle's surroundings and supervise the assisted driving operations. Here, even though the vehicle may perform all driving tasks in certain situations, the human driver is expected to be responsible for taking control as needed.

Although, for brevity and conciseness, various systems and methods are described below in conjunction with autonomous vehicles, these or similar systems and methods can be used in various driver assistance systems that do not rise to the level of fully autonomous driving systems (i.e. partially autonomous driving systems). In the United States, the Society of Automotive Engineers (SAE) has defined different levels of automated driving operations to indicate how much, or how little, a vehicle controls the driving, although different organizations, in the United States or in other countries, may categorize the levels differently. More specifically, the disclosed systems and methods can be used in SAE Level 2 driver assistance systems that implement steering, braking, acceleration, lane centering, adaptive cruise control, etc., as well as other driver support. The disclosed systems and methods can be used in SAE Level 3 driving assistance systems capable of autonomous driving under limited (e.g., highway) conditions. Likewise, the disclosed systems and methods can be used in vehicles that use SAE Level 4 self-driving systems that operate autonomously under most regular driving situations and require only occasional attention of the human operator. In all such systems, accurate lane estimation can be performed automatically without a driver input or control (e.g., while the vehicle is in motion) and result in improved reliability of vehicle positioning and navigation and the overall safety of autonomous, semi-autonomous, and other driver assistance systems. As previously noted, in addition to the way in which SAE categorizes levels of automated driving operations, other organizations, in the United States or in other countries, may categorize levels of automated driving operations differently. Without limitation, the disclosed systems and methods herein can be used in driving assistance systems defined by these other organizations' levels of automated driving operations.

As shown in FIG. 1, vehicle 100 may include various subsystems, such as propulsion system 102, sensor system 104, control system 106, one or more peripherals 108, power supply 110, computer system 112 (which could also be referred to as a computing system) with data storage 114, and user interface 116. In other examples, vehicle 100 may include more or fewer subsystems, which can each include multiple elements. The subsystems and components of vehicle 100 may be interconnected in various ways. In addition, functions of vehicle 100 described herein can be divided into additional functional or physical components, or combined into fewer functional or physical components within embodiments. For instance, the control system 106 and the computer system 112 may be combined into a single system that operates the vehicle 100 in accordance with various operations.

Propulsion system 102 may include one or more components operable to provide powered motion for vehicle 100 and can include an engine/motor 118, an energy source 119, a transmission 120, and wheels/tires 121, among other possible components. For example, engine/motor 118 may be configured to convert energy source 119 into mechanical energy and can correspond to one or a combination of an internal combustion engine, an electric motor, steam engine, or Stirling engine, among other possible options. For instance, in some embodiments, propulsion system 102 may include multiple types of engines and/or motors, such as a gasoline engine and an electric motor.

Energy source 119 represents a source of energy that may, in full or in part, power one or more systems of vehicle 100 (e.g., engine/motor 118). For instance, energy source 119 can correspond to gasoline, diesel, other petroleum-based fuels, propane, other compressed gas-based fuels, ethanol, solar panels, batteries, and/or other sources of electrical power. In some embodiments, energy source 119 may include a combination of fuel tanks, batteries, capacitors, and/or flywheels.

Transmission 120 may transmit mechanical power from engine/motor 118 to wheels/tires 121 and/or other possible systems of vehicle 100. As such, transmission 120 may include a gearbox, a clutch, a differential, and a drive shaft, among other possible components. A drive shaft may include axles that connect to one or more wheels/tires 121.

Wheels/tires 121 of vehicle 100 may have various configurations within example embodiments. For instance, vehicle 100 may exist in a unicycle, bicycle/motorcycle, tricycle, or car/truck four-wheel format, among other possible configurations. As such, wheels/tires 121 may connect to vehicle 100 in various ways and can exist in different materials, such as metal and rubber.

Sensor system 104 can include various types of sensors, such as Global Positioning System (GPS) 122, inertial measurement unit (IMU) 124, radar 126, lidar 128, camera 130, steering sensor 123, and throttle/brake sensor 125, among other possible sensors. In some embodiments, sensor system 104 may also include sensors configured to monitor internal systems of the vehicle 100 (e.g., $O_2$ monitor, fuel gauge, engine oil temperature, and brake wear).

GPS 122 may include a transceiver operable to provide information regarding the position of vehicle 100 with respect to the Earth. IMU 124 may have a configuration that uses one or more accelerometers and/or gyroscopes and may sense position and orientation changes of vehicle 100 based on inertial acceleration. For example, IMU 124 may detect a pitch and yaw of the vehicle 100 while vehicle 100 is stationary or in motion.

Radar 126 may represent one or more systems configured to use radio signals to sense objects, including the speed and heading of the objects, within the surrounding environment of vehicle 100. As such, radar 126 may include antennas configured to transmit and receive radio signals. In some embodiments, radar 126 may correspond to a mountable radar configured to obtain measurements of the surrounding environment of vehicle 100.

Lidar 128 may include one or more laser sources, a laser scanner, and one or more detectors, among other system components, and may operate in a coherent mode (e.g., using heterodyne detection) or in an incoherent detection mode (i.e., time-of-flight mode). In some embodiments, the one or more detectors of the lidar 128 may include one or more photodetectors, which may be especially sensitive detectors (e.g., avalanche photodiodes). In some examples, such photodetectors may be capable of detecting single photons (e.g., single-photon avalanche diodes (SPADs)). Further, such photodetectors can be arranged (e.g., through an electrical connection in series) into an array (e.g., as in a silicon photomultiplier (SiPM)). In some examples, the one or more photodetectors are Geiger-mode operated devices and the lidar includes subcomponents designed for such Geiger-mode operation.

Camera 130 may include one or more devices (e.g., still camera, video camera, a thermal imaging camera, a stereo camera, and a night vision camera) configured to capture images of the surrounding environment of vehicle 100.

Steering sensor 123 may sense a steering angle of vehicle 100, which may involve measuring an angle of the steering wheel or measuring an electrical signal representative of the angle of the steering wheel. In some embodiments, steering sensor 123 may measure an angle of the wheels of the vehicle 100, such as detecting an angle of the wheels with respect to a forward axis of the vehicle 100. Steering sensor 123 may also be configured to measure a combination (or a subset) of the angle of the steering wheel, electrical signal representing the angle of the steering wheel, and the angle of the wheels of vehicle 100.

Throttle/brake sensor 125 may detect the position of either the throttle position or brake position of vehicle 100. For instance, throttle/brake sensor 125 may measure the angle of both the gas pedal (throttle) and brake pedal or may measure an electrical signal that could represent, for instance, an angle of a gas pedal (throttle) and/or an angle of a brake pedal. Throttle/brake sensor 125 may also measure an angle of a throttle body of vehicle 100, which may include part of the physical mechanism that provides modulation of energy source 119 to engine/motor 118 (e.g., a butterfly valve or a carburetor). Additionally, throttle/brake sensor 125 may measure a pressure of one or more brake pads on a rotor of vehicle 100 or a combination (or a subset) of the angle of the gas pedal (throttle) and brake pedal, electrical signal representing the angle of the gas pedal (throttle) and brake pedal, the angle of the throttle body, and the pressure that at least one brake pad is applying to a rotor of vehicle 100. In other embodiments, throttle/brake sensor 125 may be configured to measure a pressure applied to a pedal of the vehicle, such as a throttle or brake pedal.

Control system 106 may include components configured to assist in navigating vehicle 100, such as steering unit 132, throttle 134, brake unit 136, sensor fusion algorithm 138, computer vision system 140, navigation/pathing system 142, and obstacle avoidance system 144. More specifically, steering unit 132 may be operable to adjust the heading of vehicle 100, and throttle 134 may control the operating speed of engine/motor 118 to control the acceleration of vehicle 100. Brake unit 136 may decelerate vehicle 100, which may involve using friction to decelerate wheels/tires 121. In some embodiments, brake unit 136 may convert kinetic energy of wheels/tires 121 to electric current for subsequent use by a system or systems of vehicle 100.

Sensor fusion algorithm 138 may include a Kalman filter, Bayesian network, or other algorithms that can process data from sensor system 104. In some embodiments, sensor fusion algorithm 138 may provide assessments based on incoming sensor data, such as evaluations of individual objects and/or features, evaluations of a particular situation, and/or evaluations of potential impacts within a given situation.

Computer vision system 140 may include hardware and software (e.g., a general purpose processor such as a central processing unit (CPU), a specialized processor such as a graphical processing unit (GPU) or a tensor processing unit (TPU), an application-specific integrated circuit (ASIC), a field programmable gate array (FPGA), a volatile memory, a non-volatile memory, or one or more machine-learned models) operable to process and analyze images in an effort to determine objects that are in motion (e.g., other vehicles, pedestrians, bicyclists, or animals) and objects that are not in motion (e.g., traffic lights, roadway boundaries, speedbumps, or potholes). As such, computer vision system 140 may use object recognition, Structure From Motion (SFM), video tracking, and other algorithms used in computer vision, for instance, to recognize objects, map an environment, track objects, estimate the speed of objects, etc.

Navigation/pathing system 142 may determine a driving path for vehicle 100, which may involve dynamically adjusting navigation during operation. As such, navigation/pathing system 142 may use data from sensor fusion algorithm 138, GPS 122, and maps, among other sources to navigate vehicle 100. Obstacle avoidance system 144 may evaluate potential obstacles based on sensor data and cause systems of vehicle 100 to avoid or otherwise negotiate the potential obstacles.

As shown in FIG. 1, vehicle 100 may also include peripherals 108, such as wireless communication system 146, touchscreen 148, interior microphone 150, and/or speaker 152. Peripherals 108 may provide controls or other elements for a user to interact with user interface 116. For example, touchscreen 148 may provide information to users of vehicle 100. User interface 116 may also accept input from the user via touchscreen 148. Peripherals 108 may also enable vehicle 100 to communicate with devices, such as other vehicle devices.

Wireless communication system 146 may wirelessly communicate with one or more devices directly or via a communication network. For example, wireless communication system 146 could use 3G cellular communication, such as code-division multiple access (CDMA), evolution-data optimized (EVDO), global system for mobile communications (GSM)/general packet radio service (GPRS), or cellular communication, such as 4G worldwide interoperability for microwave access (WiMAX) or long-term evolution (LTE), or 5G. Alternatively, wireless communication system 146 may communicate with a wireless local area network (WLAN) using WIFI® or other possible connections. Wireless communication system 146 may also communicate directly with a device using an infrared link, Bluetooth, or ZigBee, for example. Other wireless protocols, such as various vehicular communication systems, are possible within the context of the disclosure. For example, wireless communication system 146 may include one or more dedicated short-range communications (DSRC) devices that could include public and/or private data communications between vehicles and/or roadside stations.

Vehicle 100 may include power supply 110 for powering components. Power supply 110 may include a rechargeable lithium-ion or lead-acid battery in some embodiments. For instance, power supply 110 may include one or more batteries configured to provide electrical power. Vehicle 100 may also use other types of power supplies. In an example embodiment, power supply 110 and energy source 119 may be integrated into a single energy source.

Vehicle 100 may also include computer system 112 to perform operations, such as operations described therein. As such, computer system 112 may include at least one processor 113 (which could include at least one microprocessor) operable to execute instructions 115 stored in a non-transitory, computer-readable medium, such as data storage 114. In some embodiments, computer system 112 may represent a plurality of computing devices that may serve to control individual components or subsystems of vehicle 100 in a distributed fashion.

In some embodiments, data storage 114 may contain instructions 115 (e.g., program logic) executable by processor 113 to execute various functions of vehicle 100, including those described above in connection with FIG. 1. Data storage 114 may contain additional instructions as well, including instructions to transmit data to, receive data from, interact with, and/or control one or more of propulsion system 102, sensor system 104, control system 106, and peripherals 108.

In addition to instructions 115, data storage 114 may store data such as roadway maps, path information, among other information. Such information may be used by vehicle 100 and computer system 112 during the operation of vehicle 100 in the autonomous, semi-autonomous, and/or manual modes.

Vehicle 100 may include user interface 116 for providing information to or receiving input from a user of vehicle 100. User interface 116 may control or enable control of content and/or the layout of interactive images that could be displayed on touchscreen 148. Further, user interface 116 could include one or more input/output devices within the set of peripherals 108, such as wireless communication system 146, touchscreen 148, microphone 150, and speaker 152.

Computer system 112 may control the function of vehicle 100 based on inputs received from various subsystems (e.g., propulsion system 102, sensor system 104, or control system 106), as well as from user interface 116. For example, computer system 112 may utilize input from sensor system 104 in order to estimate the output produced by propulsion system 102 and control system 106. Depending upon the embodiment, computer system 112 could be operable to monitor many aspects of vehicle 100 and its subsystems. In some embodiments, computer system 112 may disable some or all functions of the vehicle 100 based on signals received from sensor system 104.

The components of vehicle 100 could be configured to work in an interconnected fashion with other components within or outside their respective systems. For instance, in an example embodiment, camera 130 could capture a plurality of images that could represent information about a state of a surrounding environment of vehicle 100 operating in an autonomous or semi-autonomous mode. The state of the surrounding environment could include parameters of the road on which the vehicle is operating. For example, computer vision system 140 may be able to recognize the slope (grade) or other features based on the plurality of images of a roadway. Additionally, the combination of GPS 122 and the features recognized by computer vision system 140 may be used with map data stored in data storage 114 to determine specific road parameters. Further, radar 126 and/or lidar 128, and/or some other environmental mapping, ranging, and/or positioning sensor system may also provide information about the surroundings of the vehicle.

In other words, a combination of various sensors (which could be termed input-indication and output-indication sensors) and computer system 112 could interact to provide an indication of an input provided to control a vehicle or an indication of the surroundings of a vehicle.

In some embodiments, computer system 112 may make a determination about various objects based on data that is provided by systems other than the radio system. For example, vehicle 100 may have lasers or other optical sensors configured to sense objects in a field of view of the vehicle. Computer system 112 may use the outputs from the various sensors to determine information about objects in a field of view of the vehicle, and may determine distance and direction information to the various objects. Computer system 112 may also determine whether objects are desirable or undesirable based on the outputs from the various sensors.

Although FIG. 1 shows various components of vehicle 100 (i.e., wireless communication system 146, computer system 112, data storage 114, and user interface 116) as being integrated into the vehicle 100, one or more of these components could be mounted or associated separately from vehicle 100. For example, data storage 114 could, in part or in full, exist separate from vehicle 100. Thus, vehicle 100 could be provided in the form of device elements that may be located separately or together. The device elements that make up vehicle 100 could be communicatively coupled together in a wired and/or wireless fashion.

FIGS. 2A-2E show an example vehicle 200 (e.g., a fully autonomous vehicle or semi-autonomous vehicle) that can include some or all of the functions described in connection with vehicle 100 in reference to FIG. 1. Although vehicle 200 is illustrated in FIGS. 2A-2E as a van with side view mirrors for illustrative purposes, the present disclosure is not so limited. For instance, the vehicle 200 can represent a truck, a car, a semi-trailer truck, a motorcycle, a golf cart, an off-road vehicle, a farm vehicle, or any other vehicle that is described elsewhere herein (e.g., buses, boats, airplanes, helicopters, drones, lawn mowers, earth movers, submarines, all-terrain vehicles, snowmobiles, aircraft, recreational vehicles, amusement park vehicles, farm equipment, construction equipment or vehicles, warehouse equipment or vehicles, factory equipment or vehicles, trams, trains, trolleys, sidewalk delivery vehicles, and robot devices).

The example vehicle 200 may include one or more sensor systems 202, 204, 206, 208, 210, 212, 214, and 218. In some embodiments, sensor systems 202, 204, 206, 208, 210, 212, 214, and/or 218 could represent one or more optical systems (e.g. cameras), one or more lidars, one or more radars, one or more inertial sensors, one or more humidity sensors, one or more acoustic sensors (e.g., microphones or sonar devices), or one or more other sensors configured to sense information about an environment surrounding the vehicle 200. In other words, any sensor system now known or later created could be coupled to the vehicle 200 and/or could be utilized in conjunction with various operations of the vehicle 200. As an example, a lidar could be utilized in self-driving or other types of navigation, planning, perception, and/or mapping operations of the vehicle 200. In addition, sensor systems 202, 204, 206, 208, 210, 212, 214, and/or 218 could represent a combination of sensors described herein (e.g., one or more lidars and radars; one or more lidars and cameras; one or more cameras and radars; or one or more lidars, cameras, and radars).

Note that the number, location, and type of sensor systems (e.g., 202 and 204) depicted in FIGS. 2A-E are intended as a non-limiting example of the location, number, and type of such sensor systems of an autonomous or semi-autonomous vehicle. Alternative numbers, locations, types, and configurations of such sensors are possible (e.g., to comport with vehicle size, shape, aerodynamics, fuel economy, aesthetics, or other conditions, to reduce cost, or to adapt to specialized environmental or application circumstances). For example, the sensor systems (e.g., 202 and 204) could be disposed in various other locations on the vehicle (e.g., at location 216) and could have fields of view that correspond to internal and/or surrounding environments of the vehicle 200.

The sensor system 202 may be mounted atop the vehicle 200 and may include one or more sensors configured to detect information about an environment surrounding the vehicle 200, and output indications of the information. For example, sensor system 202 can include any combination of cameras, radars, lidars, inertial sensors, humidity sensors, and acoustic sensors (e.g., microphones or sonar devices). The sensor system 202 can include one or more movable mounts that could be operable to adjust the orientation of one or more sensors in the sensor system 202. In one embodiment, the movable mount could include a rotating platform that could scan sensors so as to obtain information from each direction around the vehicle 200. In another embodiment, the movable mount of the sensor system 202 could be movable in a scanning fashion within a particular range of angles and/or azimuths and/or elevations. The sensor system 202 could be mounted atop the roof of a car, although other mounting locations are possible.

Additionally, the sensors of sensor system 202 could be distributed in different locations and need not be collocated in a single location. Furthermore, each sensor of sensor system 202 can be configured to be moved or scanned independently of other sensors of sensor system 202. Additionally or alternatively, multiple sensors may be mounted at one or more of the sensor locations 202, 204, 206, 208, 210, 212, 214, and/or 218. For example, there may be two lidar devices mounted at a sensor location and/or there may be one lidar device and one radar mounted at a sensor location.

The one or more sensor systems 202, 204, 206, 208, 210, 212, 214, and/or 218 could include one or more lidar sensors. For example, the lidar sensors could include a plurality of light-emitter devices arranged over a range of angles with respect to a given plane (e.g., the x-y plane). For example, one or more of the sensor systems 202, 204, 206, 208, 210, 212, 214, and/or 218 may be configured to rotate or pivot about an axis (e.g., the z-axis) perpendicular to the given plane so as to illuminate an environment surrounding the vehicle 200 with light pulses. Based on detecting various aspects of reflected light pulses (e.g., the elapsed time of flight, polarization, or intensity), information about the surrounding environment may be determined.

In an example embodiment, sensor systems 202, 204, 206, 208, 210, 212, 214, and/or 218 may be configured to provide respective point cloud information that may relate to physical objects within the surrounding environment of the vehicle 200. While vehicle 200 and sensor systems 202, 204, 206, 208, 210, 212, 214, and 218 are illustrated as including certain features, it will be understood that other types of sensor systems are contemplated within the scope of the present disclosure. Further, the example vehicle 200 can include any of the components described in connection with vehicle 100 of FIG. 1.

In an example configuration, one or more radars can be located on vehicle 200. Similar to radar 126 described above, the one or more radars may include antennas configured to transmit and receive radio waves (e.g., electromagnetic waves having frequencies between 30 Hz and 300 GHz). Such radio waves may be used to determine the distance to and/or velocity of one or more objects in the surrounding environment of the vehicle 200. For example, one or more sensor systems 202, 204, 206, 208, 210, 212, 214, and/or 218 could include one or more radars. In some examples, one or more radars can be located near the rear of the vehicle 200 (e.g., sensor systems 208 and 210), to actively scan the environment near the back of the vehicle 200 for the presence of radio-reflective objects. Similarly, one or more radars can be located near the front of the vehicle 200 (e.g., sensor systems 212 or 214) to actively scan the environment near the front of the vehicle 200. A radar can be situated, for example, in a location suitable to illuminate a region including a forward-moving path of the vehicle 200 without occlusion by other features of the vehicle 200. For example, a radar can be embedded in and/or mounted in or near the front bumper, front headlights, cowl, and/or hood, etc. Furthermore, one or more additional radars can be located to actively scan the side and/or rear of the vehicle 200 for the presence of radio-reflective objects, such as by including such devices in or near the rear bumper, side panels, rocker panels, and/or undercarriage, etc.

The vehicle 200 can include one or more cameras. For example, the one or more sensor systems 202, 204, 206, 208, 210, 212, 214, and/or 218 could include one or more cameras. The camera can be a photosensitive instrument, such as a still camera, a video camera, a thermal imaging camera, a stereo camera, a night vision camera, etc., that is configured to capture a plurality of images of the surrounding environment of the vehicle 200. To this end, the camera can be configured to detect visible light, and can additionally or alternatively be configured to detect light from other portions of the spectrum, such as infrared or ultraviolet light. The camera can be a two-dimensional detector, and can optionally have a three-dimensional spatial range of sensitivity. In some embodiments, the camera can include, for example, a range detector configured to generate a two-dimensional image indicating distance from the camera to a number of points in the surrounding environment. To this end, the camera may use one or more range detecting techniques. For example, the camera can provide range information by using a structured light technique in which the vehicle 200 illuminates an object in the surrounding environment with a predetermined light pattern, such as a grid or checkerboard pattern and uses the camera to detect a reflection of the predetermined light pattern from environmental surroundings. Based on distortions in the reflected light pattern, the vehicle 200 can determine the distance to the points on the object. The predetermined light pattern may comprise infrared light, or radiation at other suitable wavelengths for such measurements. In some examples, the camera can be mounted inside a front windshield of the vehicle 200. Specifically, the camera can be situated to capture images from a forward-looking view with respect to the orientation of the vehicle 200. Other mounting locations and viewing angles of the camera can also be used, either inside or outside the vehicle 200. Further, the camera can have associated optics operable to provide an adjustable field of view. Still further, the camera can be mounted to vehicle 200 with a movable mount to vary a pointing angle of the camera, such as via a pan/tilt mechanism.

The vehicle 200 may also include one or more acoustic sensors (e.g., one or more of the sensor systems 202, 204, 206, 208, 210, 212, 214, 216, 218 may include one or more acoustic sensors) used to sense a surrounding environment of vehicle 200. Acoustic sensors may include microphones (e.g., piezoelectric microphones, condenser microphones, ribbon microphones, or microelectromechanical systems (MEMS) microphones) used to sense acoustic waves (i.e., pressure differentials) in a fluid (e.g., air) of the environment surrounding the vehicle 200. Such acoustic sensors may be used to identify sounds in the surrounding environment (e.g., sirens, human speech, animal sounds, or alarms) upon which control strategy for vehicle 200 may be based. For example, if the acoustic sensor detects a siren (e.g., an ambulatory siren or a fire engine siren), vehicle 200 may slow down and/or navigate to the edge of a roadway.

Although not shown in FIGS. 2A-2E, the vehicle 200 can include a wireless communication system (e.g., similar to the wireless communication system 146 of FIG. 1 and/or in addition to the wireless communication system 146 of FIG. 1). The wireless communication system may include wireless transmitters and receivers that could be configured to communicate with devices external or internal to the vehicle 200. Specifically, the wireless communication system could include transceivers configured to communicate with other vehicles and/or computing devices, for instance, in a vehicular communication system or a roadway station. Examples of such vehicular communication systems include DSRC, radio frequency identification (RFID), and other proposed communication standards directed towards intelligent transport systems.

The vehicle 200 may include one or more other components in addition to or instead of those shown. The additional components may include electrical or mechanical functionality.

A control system of the vehicle 200 may be configured to control the vehicle 200 in accordance with a control strategy from among multiple possible control strategies. The control system may be configured to receive information from sensors coupled to the vehicle 200 (on or off the vehicle 200), modify the control strategy (and an associated driving behavior) based on the information, and control the vehicle 200 in accordance with the modified control strategy. The control system further may be configured to monitor the information received from the sensors, and continuously evaluate driving conditions; and also may be configured to modify the control strategy and driving behavior based on changes in the driving conditions. For example, a route taken by a vehicle from one destination to another may be modified based on driving conditions. Additionally or alternatively, the velocity, acceleration, turn angle, follow distance (i.e., distance to a vehicle ahead of the present vehicle), lane selection, etc. could all be modified in response to changes in the driving conditions.

Figure 2A:
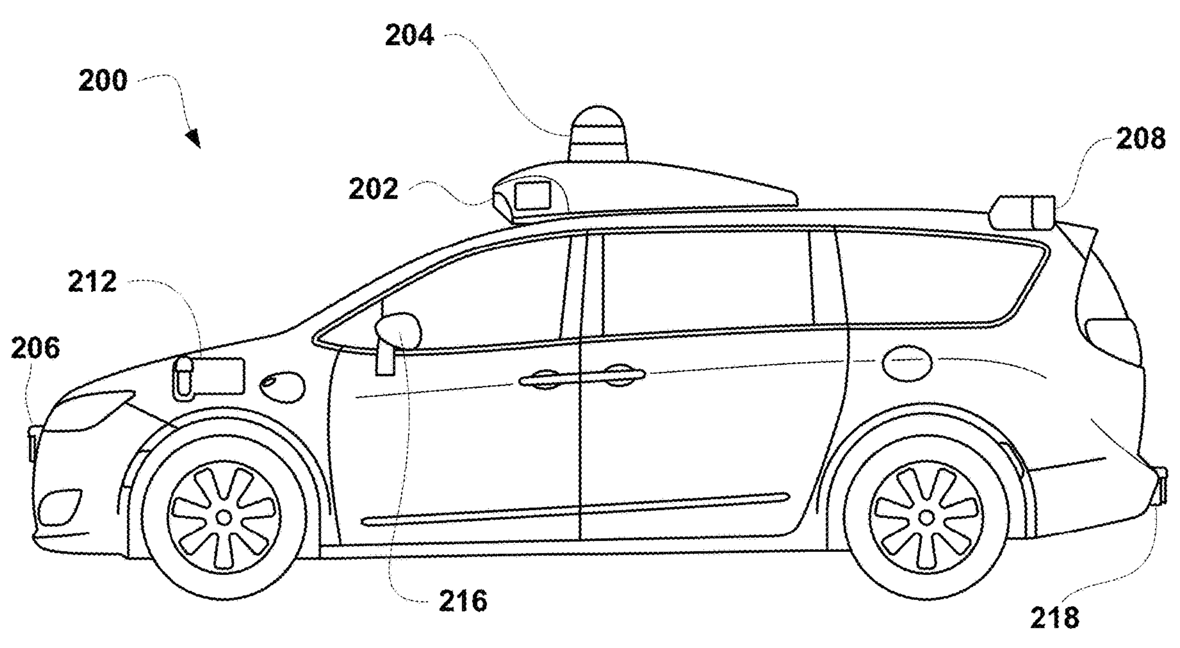
FIG. 2A is an illustration of a physical configuration of a vehicle, according to example embodiments.
Figure 2B:
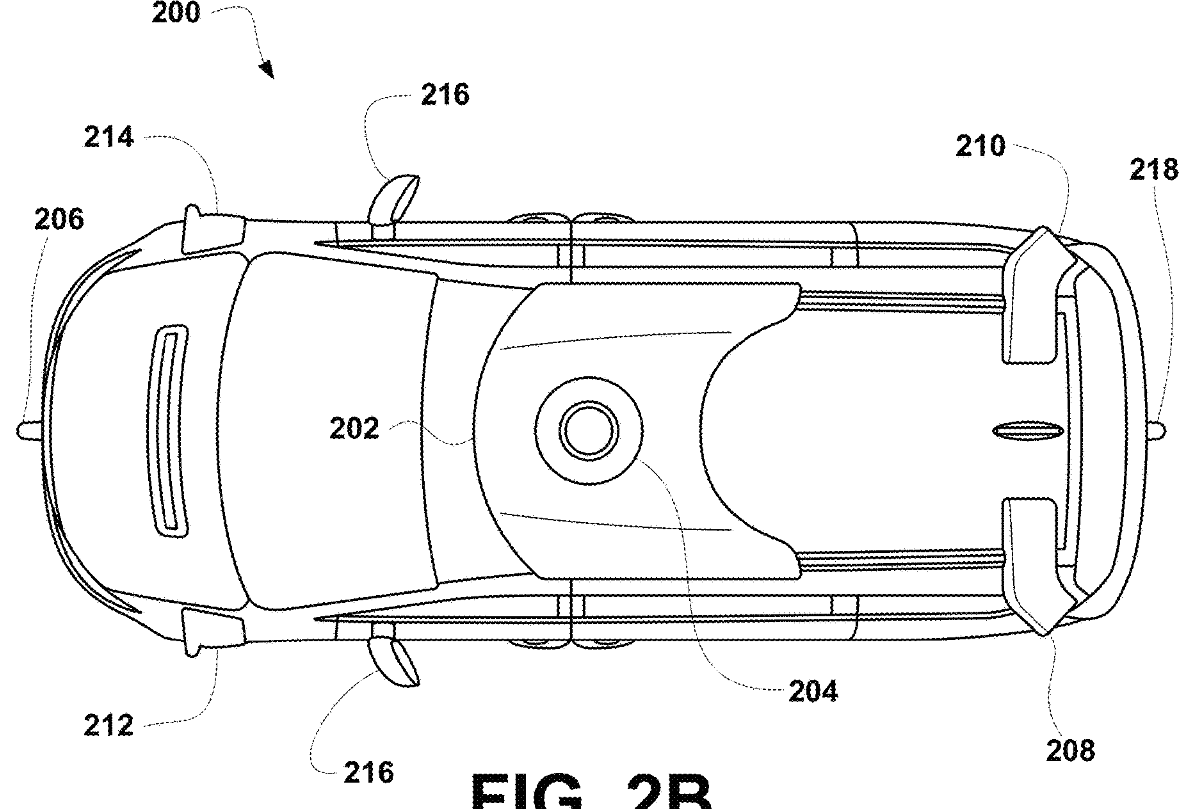
FIG. 2B is an illustration of a physical configuration of a vehicle, according to example embodiments.
Figure 2C:
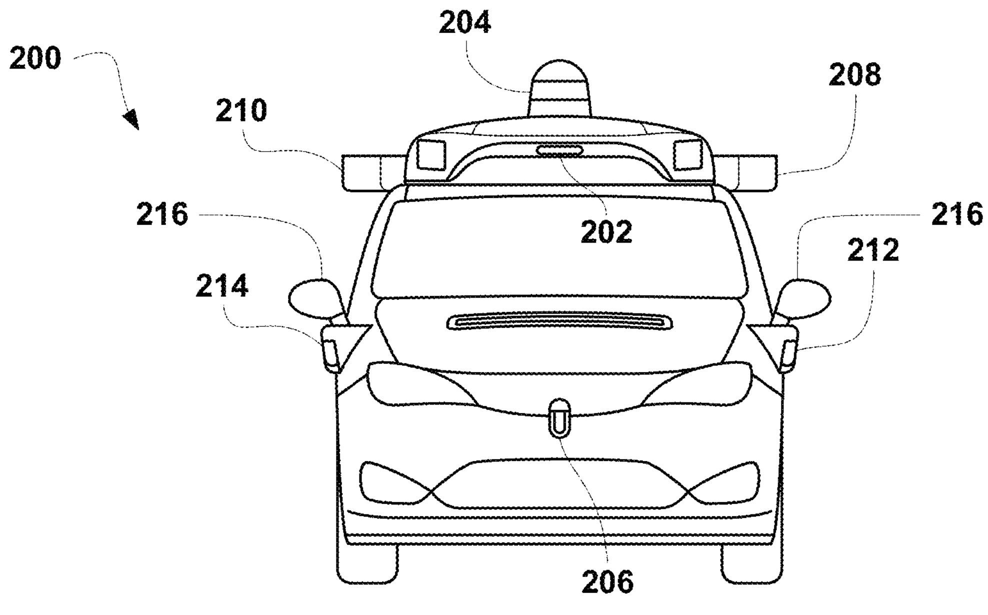
FIG. 2C is an illustration of a physical configuration of a vehicle, according to example embodiments.
Figure 2D:
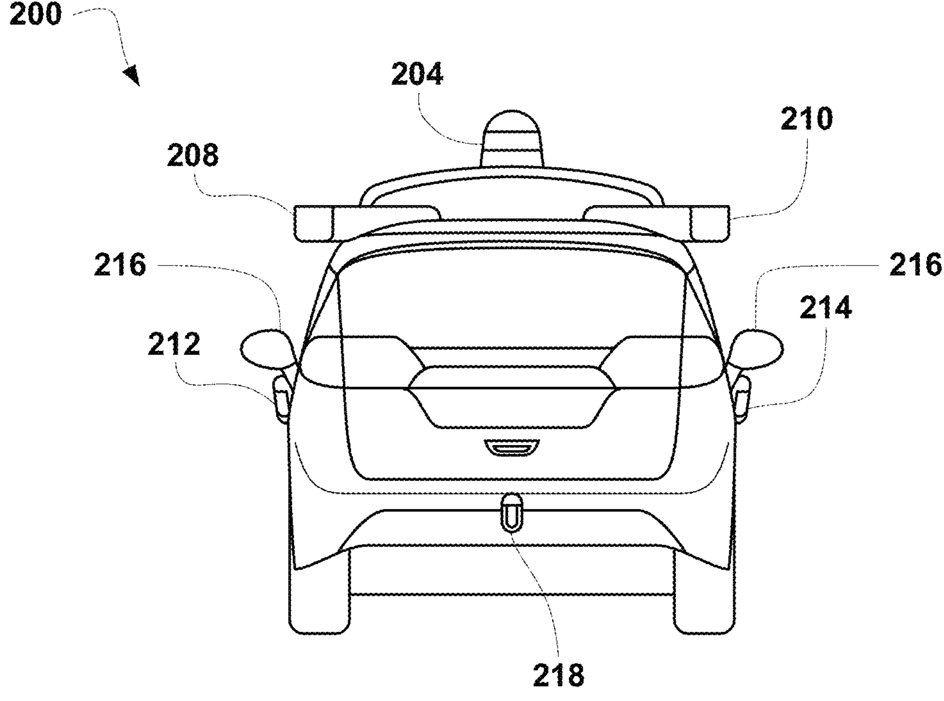
FIG. 2D is an illustration of a physical configuration of a vehicle, according to example embodiments.
Figure 2E:
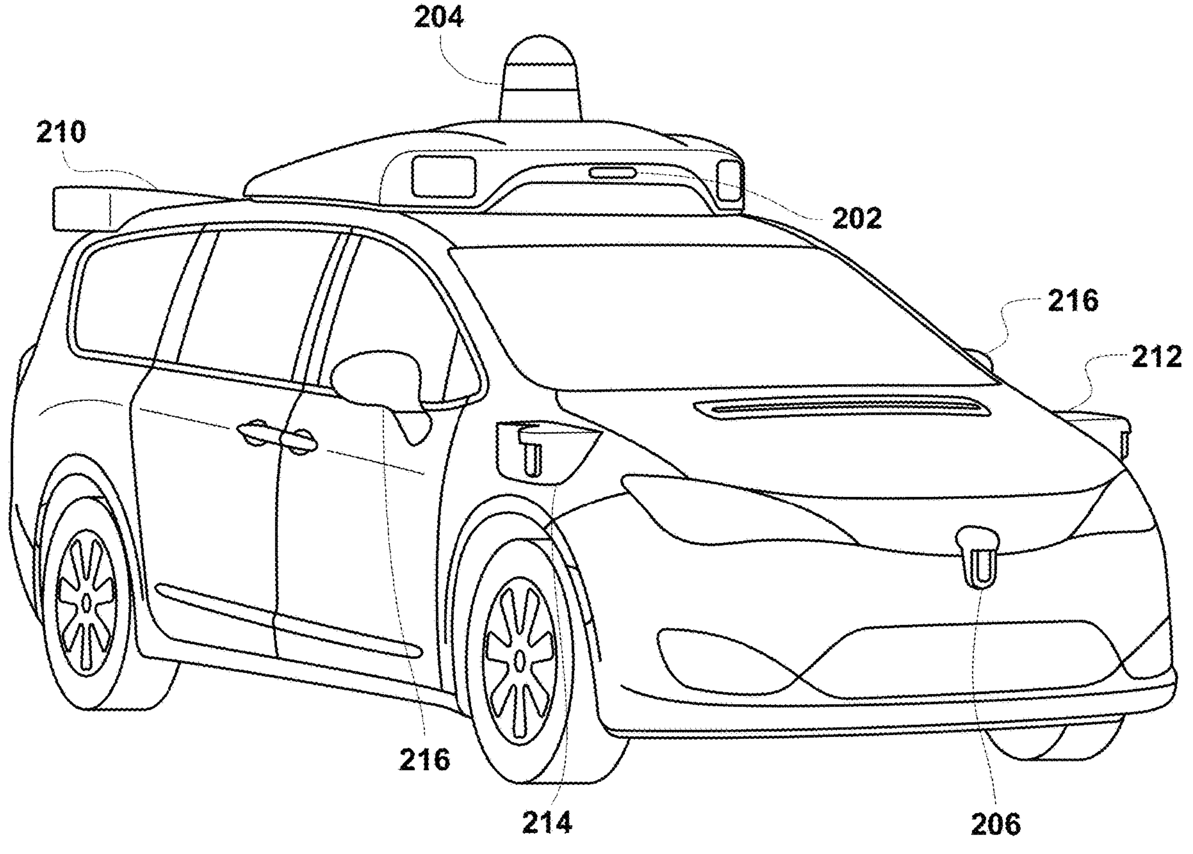
FIG. 2E is an illustration of a physical configuration of a vehicle, according to example embodiments.
Figure 2F:
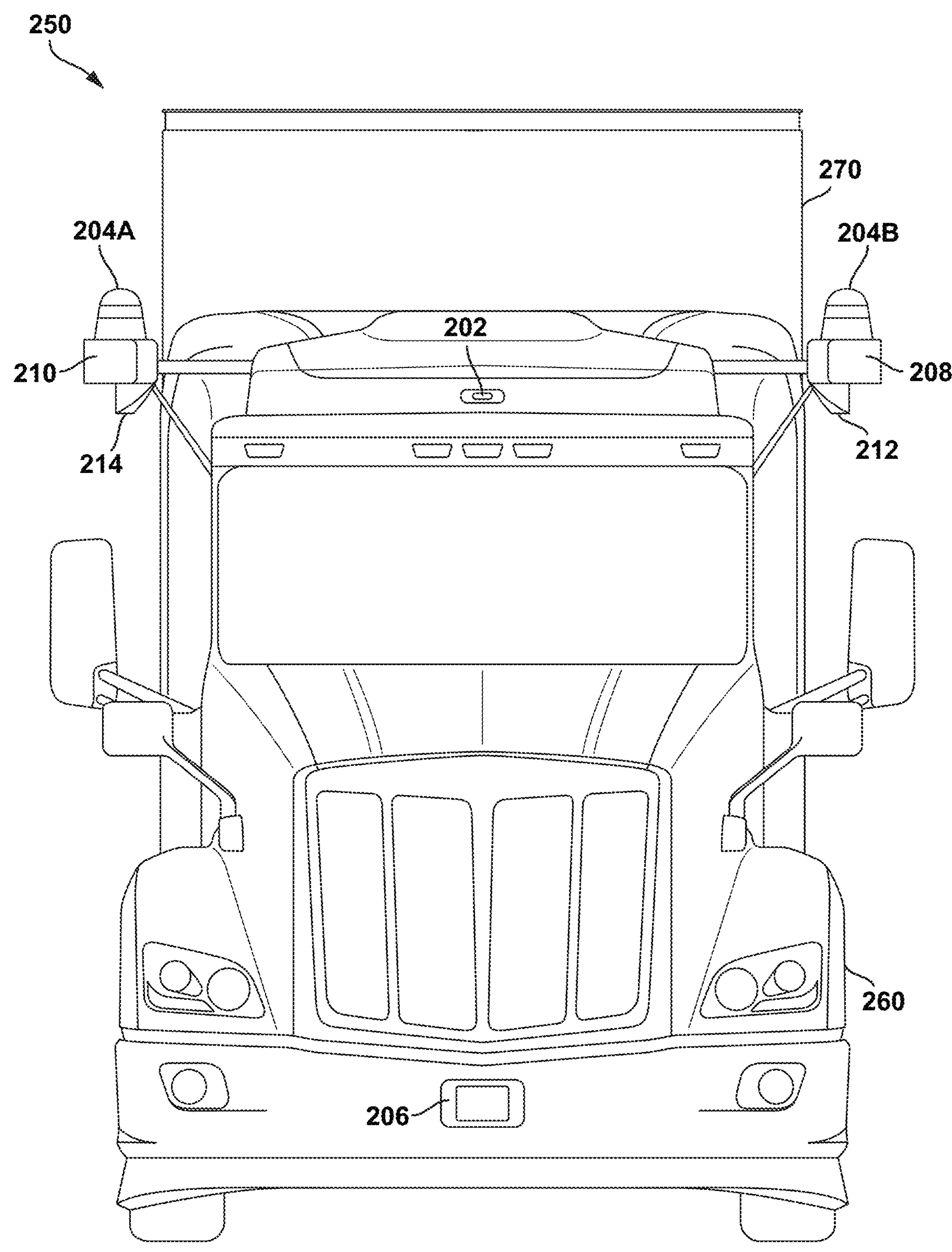
FIG. 2F is an illustration of a physical configuration of a vehicle, according to example embodiments.
Figure 2G:
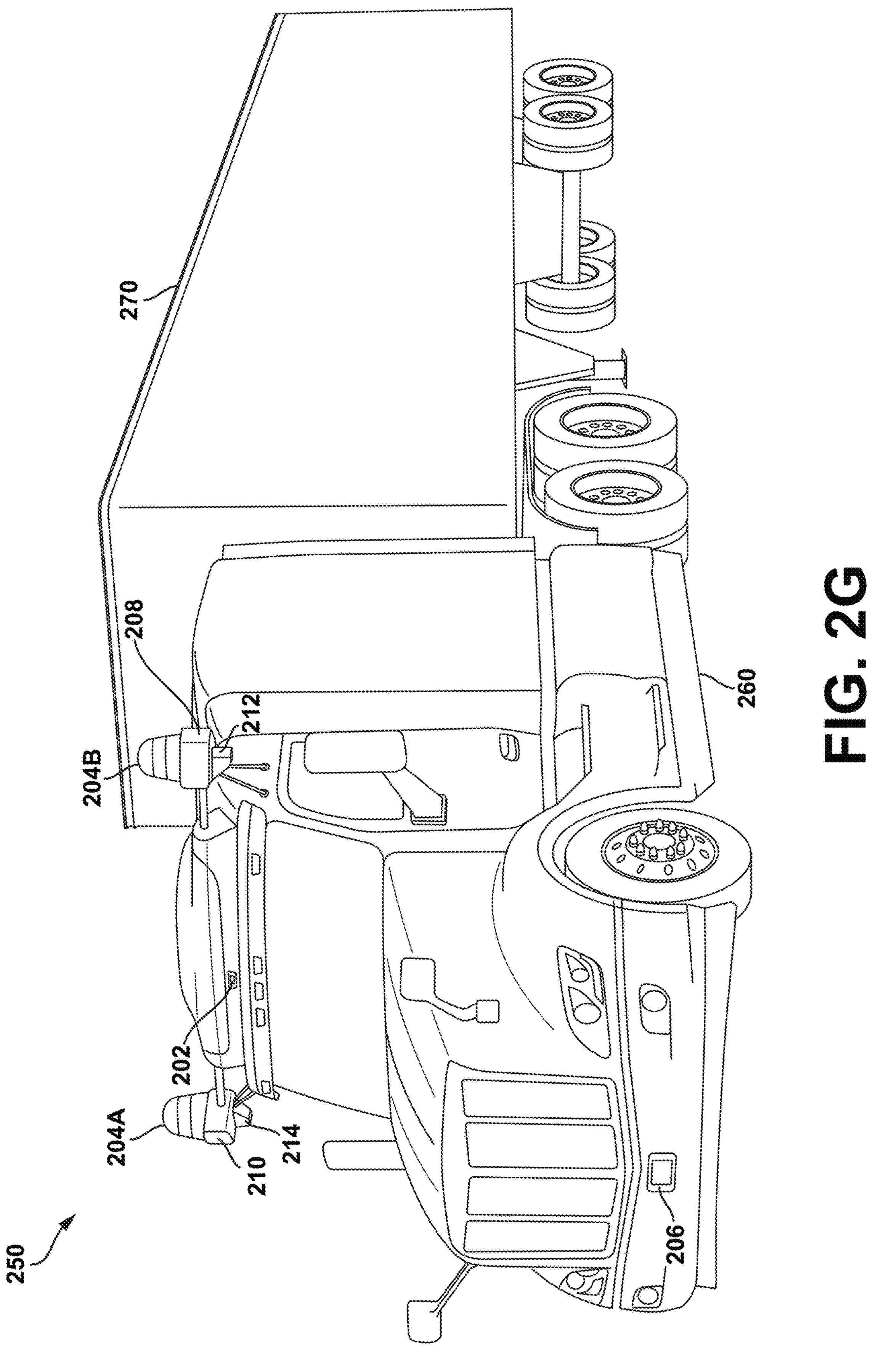
FIG. 2G is an illustration of a physical configuration of a vehicle, according to example embodiments.
Figure 2H:
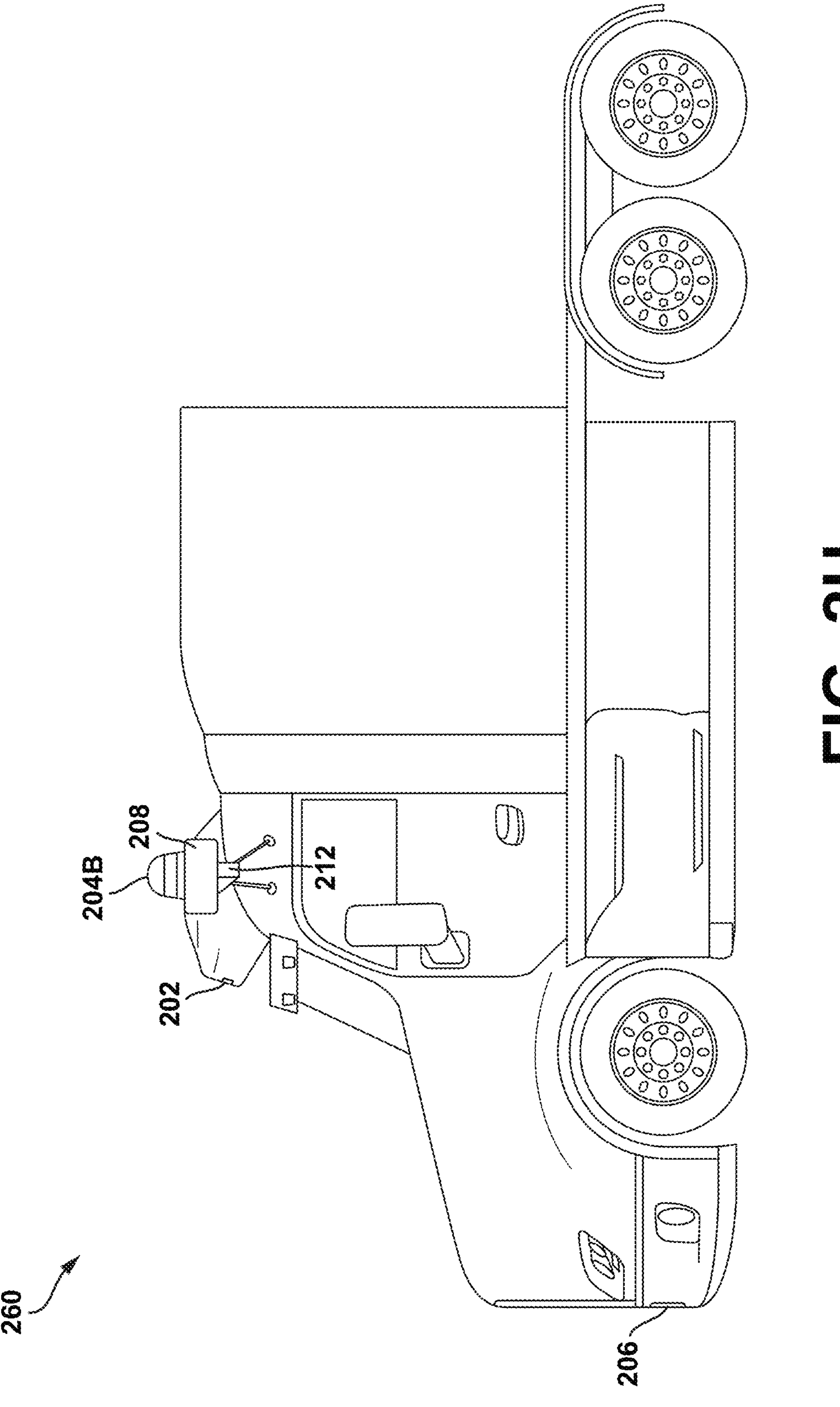
FIG. 2H is an illustration of a physical configuration of a vehicle, according to example embodiments.
Figure 2I:
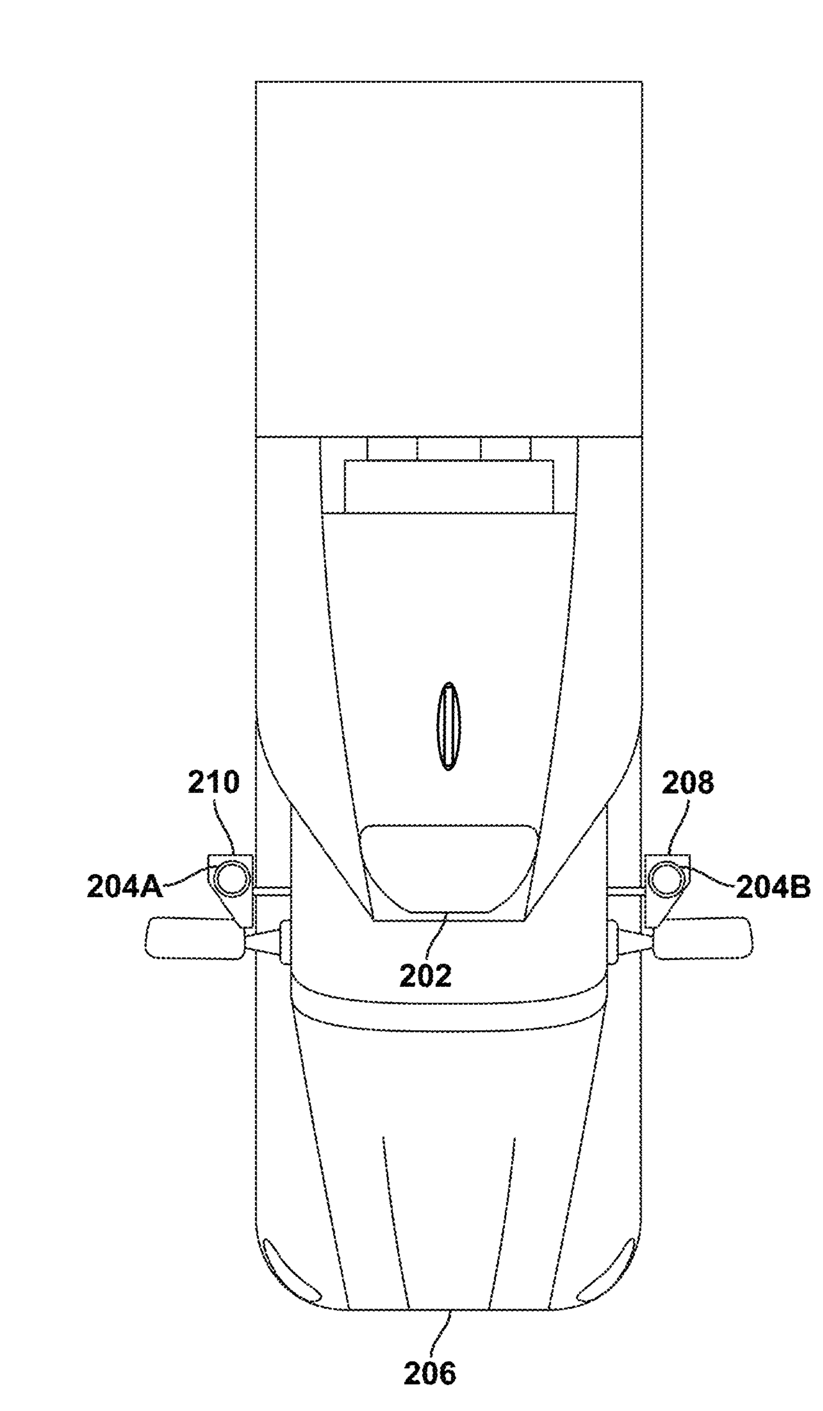
FIG. 2I is an illustration of a physical configuration of a vehicle, according to example embodiments.

As described above, in some embodiments, the vehicle 200 may take the form of a van, but alternate forms are also possible and are contemplated herein. As such, FIGS. 2F-2I illustrate embodiments where a vehicle 250 takes the form of a semi-truck. For example, FIG. 2F illustrates a front-view of the vehicle 250 and FIG. 2G illustrates an isometric view of the vehicle 250. In embodiments where the vehicle 250 is a semi-truck, the vehicle 250 may include a tractor portion 260 and a trailer portion 270 (illustrated in FIG. 2G). FIGS. 2H and 2I provide a side view and a top view, respectively, of the tractor portion 260. Similar to the vehicle 200 illustrated above, the vehicle 250 illustrated in FIGS. 2F-2I may also include a variety of sensor systems (e.g., similar to the sensor systems 202, 206, 208, 210, 212, 214 shown and described with reference to FIGS. 2A-2E). In some embodiments, whereas the vehicle 200 of FIGS. 2A-2E may only include a single copy of some sensor systems (e.g., the sensor system 204), the vehicle 250 illustrated in FIGS. 2F-2I may include multiple copies of that sensor system (e.g., the sensor systems 204A and 204B, as illustrated).

While drawings and description throughout may reference a given form of vehicle (e.g., the semi-truck vehicle 250 or the van vehicle 200), it is understood that embodiments described herein can be equally applied in a variety of vehicle contexts (e.g., with modifications employed to account for a form factor of vehicle). For example, sensors and/or other components described or illustrated as being part of the van vehicle 200 could also be used (e.g., for navigation and/or obstacle detection and avoidance) in the semi-truck vehicle 250

Figure 2J:
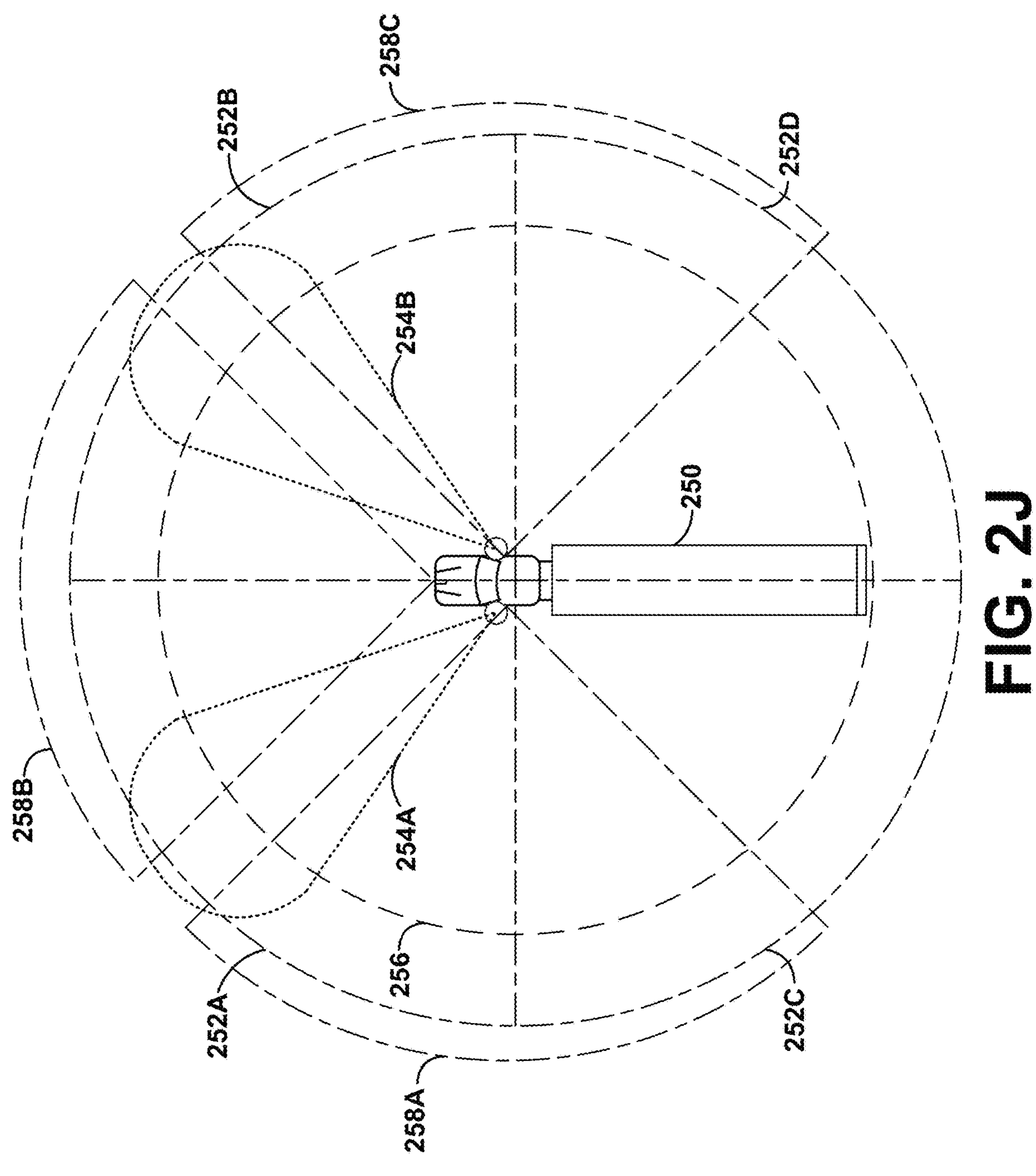
FIG. 2J is an illustration of a field of view for various sensors, according to example embodiments.

FIG. 2J illustrates various sensor fields of view (e.g., associated with the vehicle 250 described above). As described above, vehicle 250 may contain a plurality of sensors/sensor units. The locations of the various sensors may correspond to the locations of the sensors disclosed in FIGS. 2F-2I, for example. However, in some instances, the sensors may have other locations. Sensors location reference numbers are omitted from FIG. 2J for simplicity of the drawing. For each sensor unit of vehicle 250, FIG. 2J illustrates a representative field of view (e.g., fields of view labeled as 252A, 252B, 252C, 252D, 254A, 254B, 256, 258A, 258B, and 258C). The field of view of a sensor may include an angular region (e.g., an azimuthal angular region and/or an elevational angular region) over which the sensor may detect objects.

Figure 2K:
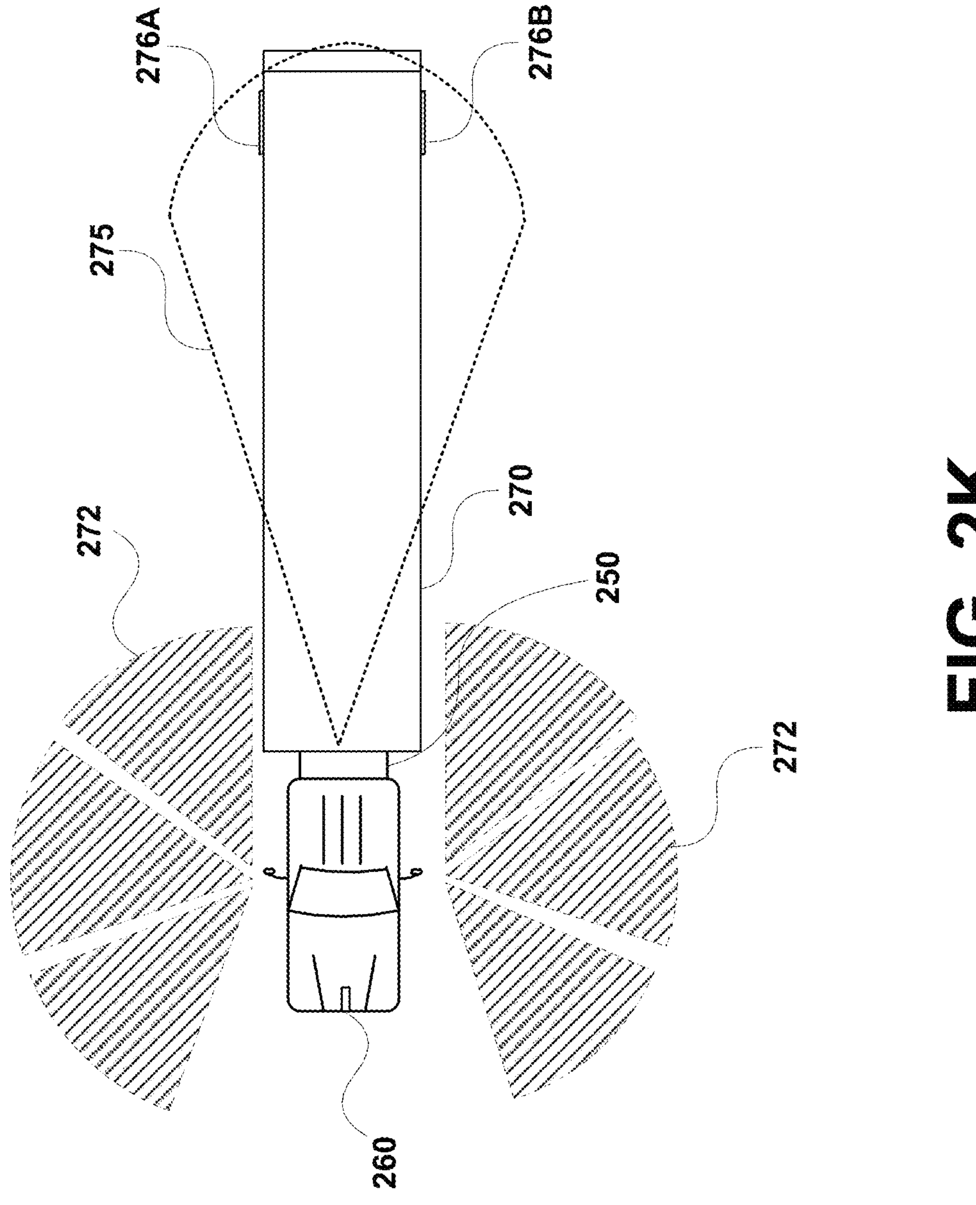
FIG. 2K is an illustration of beam steering for a sensor, according to example embodiments.

FIG. 2K illustrates beam steering for a sensor of a vehicle (e.g., the vehicle 250 shown and described with reference to FIGS. 2F-2J), according to example embodiments. In various embodiments, a sensor unit of vehicle 250 may be a radar, a lidar, a sonar, etc. Further, in some embodiments, during the operation of the sensor, the sensor may be scanned within the field of view of the sensor. Various different scanning angles for an example sensor are shown as regions 272, which each indicate the angular region over which the sensor is operating. The sensor may periodically or iteratively change the region over which it is operating. In some embodiments, multiple sensors may be used by vehicle 250 to measure regions 272. In addition, other regions may be included in other examples. For instance, one or more sensors may measure aspects of the trailer 270 of vehicle 250 and/or a region directly in front of vehicle 250.

At some angles, region of operation 275 of the sensor may include rear wheels 276A, 276B of trailer 270. Thus, the sensor may measure rear wheel 276A and/or rear wheel 276B during operation. For example, rear wheels 276A, 276B may reflect lidar signals or radar signals transmitted by the sensor. The sensor may receive the reflected signals from rear wheels 276A, 276. Therefore, the data collected by the sensor may include data from the reflections off the wheel.

In some instances, such as when the sensor is a radar, the reflections from rear wheels 276A, 276B may appear as noise in the received radar signals. Consequently, the radar may operate with an enhanced signal to noise ratio in instances where rear wheels 276A, 276B direct radar signals away from the sensor.

Figure 3:
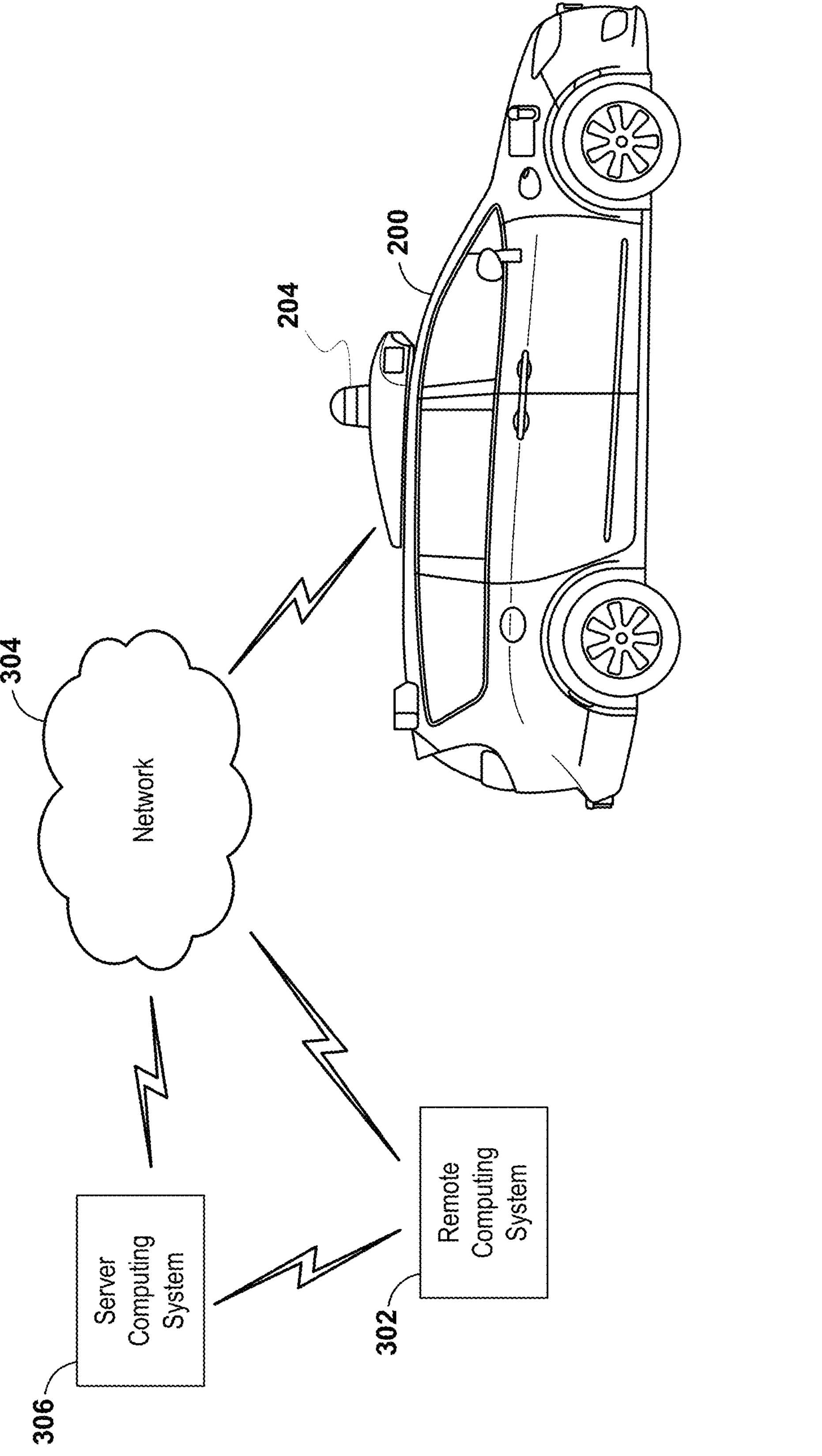
FIG. 3 is a conceptual illustration of wireless communication between various computing systems related to an autonomous or semi-autonomous vehicle, according to example embodiments.

FIG. 3 is a conceptual illustration of wireless communication between various computing systems related to an autonomous or semi-autonomous vehicle, according to example embodiments. In particular, wireless communication may occur between remote computing system 302 and vehicle 200 via network 304. Wireless communication may also occur between server computing system 306 and remote computing system 302, and between server computing system 306 and vehicle 200.

Vehicle 200 can correspond to various types of vehicles capable of transporting passengers or objects between locations, and may take the form of any one or more of the vehicles discussed above. In some instances, vehicle 200 may operate in an autonomous or semi-autonomous mode that enables a control system to safely navigate vehicle 200 between destinations using sensor measurements. When operating in an autonomous or semi-autonomous mode, vehicle 200 may navigate with or without passengers. As a result, vehicle 200 may pick up and drop off passengers between desired destinations.

Remote computing system 302 may represent any type of device related to remote assistance techniques, including but not limited to those described herein. Within examples, remote computing system 302 may represent any type of device configured to (i) receive information related to vehicle 200, (ii) provide an interface through which a human operator can in turn perceive the information and input a response related to the information, and (iii) transmit the response to vehicle 200 or to other devices. Remote computing system 302 may take various forms, such as a workstation, a desktop computer, a laptop, a tablet, a mobile phone (e.g., a smart phone), and/or a server. In some examples, remote computing system 302 may include multiple computing devices operating together in a network configuration.

Remote computing system 302 may include one or more subsystems and components similar or identical to the subsystems and components of vehicle 200. At a minimum, remote computing system 302 may include a processor configured for performing various operations described herein. In some embodiments, remote computing system 302 may also include a user interface that includes input/output devices, such as a touchscreen and a speaker. Other examples are possible as well.

Network 304 represents infrastructure that enables wireless communication between remote computing system 302 and vehicle 200. Network 304 also enables wireless communication between server computing system 306 and remote computing system 302, and between server computing system 306 and vehicle 200.

The position of remote computing system 302 can vary within examples. For instance, remote computing system 302 may have a remote position from vehicle 200 that has a wireless communication via network 304. In another example, remote computing system 302 may correspond to a computing device within vehicle 200 that is separate from vehicle 200, but with which a human operator can interact while a passenger or driver of vehicle 200. In some examples, remote computing system 302 may be a computing device with a touchscreen operable by the passenger of vehicle 200.

In some embodiments, operations described herein that are performed by remote computing system 302 may be additionally or alternatively performed by vehicle 200 (i.e., by any system(s) or subsystem(s) of vehicle 200). In other words, vehicle 200 may be configured to provide a remote assistance mechanism with which a driver or passenger of the vehicle can interact.

Server computing system 306 may be configured to wirelessly communicate with remote computing system 302 and vehicle 200 via network 304 (or perhaps directly with remote computing system 302 and/or vehicle 200). Server computing system 306 may represent any computing device configured to receive, store, determine, and/or send information relating to vehicle 200 and the remote assistance thereof. As such, server computing system 306 may be configured to perform any operation(s), or portions of such operation(s), that is/are described herein as performed by remote computing system 302 and/or vehicle 200. Some embodiments of wireless communication related to remote assistance may utilize server computing system 306, while others may not.

Server computing system 306 may include one or more subsystems and components similar or identical to the subsystems and components of remote computing system 302 and/or vehicle 200, such as a processor configured for performing various operations described herein, and a wireless communication interface for receiving information from, and providing information to, remote computing system 302 and vehicle 200.

The various systems described above may perform various operations. These operations and related features will now be described.

In line with the discussion above, a computing system (e.g., remote computing system 302, server computing system 306, or a computing system local to vehicle 200) may operate to use a camera to capture images of the surrounding environment of an autonomous or semi-autonomous vehicle. In general, at least one computing system will be able to analyze the images and possibly control the autonomous or semi-autonomous vehicle.

In some embodiments, to facilitate autonomous or semi-autonomous operation, a vehicle (e.g., vehicle 200) may receive data representing objects in an environment surrounding the vehicle (also referred to herein as "environment data") in a variety of ways. A sensor system on the vehicle may provide the environment data representing objects of the surrounding environment. For example, the vehicle may have various sensors, including a camera, a radar, a lidar, a microphone, a radio unit, and other sensors. Each of these sensors may communicate environment data to a processor in the vehicle about information each respective sensor receives.

In one example, a camera may be configured to capture still images and/or video. In some embodiments, the vehicle may have more than one camera positioned in different orientations. Also, in some embodiments, the camera may be able to move to capture images and/or video in different directions. The camera may be configured to store captured images and video to a memory for later processing by a processing system of the vehicle. The captured images and/or video may be the environment data. Further, the camera may include an image sensor as described herein.

In another example, a radar may be configured to transmit an electromagnetic signal that will be reflected by various objects near the vehicle, and then capture electromagnetic signals that reflect off the objects. The captured reflected electromagnetic signals may enable the radar (or processing system) to make various determinations about objects that reflected the electromagnetic signal. For example, the distances to and positions of various reflecting objects may be determined. In some embodiments, the vehicle may have more than one radar in different orientations. The radar may be configured to store captured information to a memory for later processing by a processing system of the vehicle. The information captured by the radar may be environment data.

In another example, a lidar may be configured to transmit an electromagnetic signal (e.g., infrared light, such as that from a gas or diode laser, or other possible light source) that will be reflected by target objects near the vehicle. The lidar may be able to capture the reflected electromagnetic (e.g., infrared light) signals. The captured reflected electromagnetic signals may enable the range-finding system (or processing system) to determine a range to various objects. The lidar may also be able to determine a velocity or speed of target objects and store it as environment data.

Additionally, in an example, a microphone may be configured to capture audio of the environment surrounding the vehicle. Sounds captured by the microphone may include emergency vehicle sirens and the sounds of other vehicles. For example, the microphone may capture the sound of the siren of an ambulance, fire engine, or police vehicle. A processing system may be able to identify that the captured audio signal is indicative of an emergency vehicle. In another example, the microphone may capture the sound of an exhaust of another vehicle, such as that from a motorcycle. A processing system may be able to identify that the captured audio signal is indicative of a motorcycle. The data captured by the microphone may form a portion of the environment data.

In yet another example, the radio unit may be configured to transmit an electromagnetic signal that may take the form of a Bluetooth signal, 802.11 signal, and/or other radio technology signal. The first electromagnetic radiation signal may be transmitted via one or more antennas located in a radio unit. Further, the first electromagnetic radiation signal may be transmitted with one of many different radio-signaling modes. However, in some embodiments it is desirable to transmit the first electromagnetic radiation signal with a signaling mode that requests a response from devices located near the autonomous or semi-autonomous vehicle. The processing system may be able to detect nearby devices based on the responses communicated back to the radio unit and use this communicated information as a portion of the environment data.

In some embodiments, the processing system may be able to combine information from the various sensors in order to make further determinations of the surrounding environment of the vehicle. For example, the processing system may combine data from both radar information and a captured image to determine if another vehicle or pedestrian is in front of the autonomous or semi-autonomous vehicle. In other embodiments, other combinations of sensor data may be used by the processing system to make determinations about the surrounding environment.

While operating in an autonomous mode (or semi-autonomous mode), the vehicle may control its operation with little-to-no human input. For example, a human-operator may enter an address into the vehicle and the vehicle may then be able to drive, without further input from the human (e.g., the human does not have to steer or touch the brake/gas pedals), to the specified destination. Further, while the vehicle is operating autonomously or semi-autonomously, the sensor system may be receiving environment data. The processing system of the vehicle may alter the control of the vehicle based on environment data received from the various sensors. In some examples, the vehicle may alter a velocity of the vehicle in response to environment data from the various sensors. The vehicle may change velocity in order to avoid obstacles, obey traffic laws, etc. When a processing system in the vehicle identifies objects near the vehicle, the vehicle may be able to change velocity, or alter the movement in another way.

When the vehicle detects an object but is not highly confident in the detection of the object, the vehicle can request a human operator (or a more powerful computer) to perform one or more remote assistance tasks, such as (i) confirm whether the object is in fact present in the surrounding environment (e.g., if there is actually a stop sign or if there is actually no stop sign present), (ii) confirm whether the vehicle's identification of the object is correct, (iii) correct the identification if the identification was incorrect, and/or (iv) provide a supplemental instruction (or modify a present instruction) for the autonomous or semi-autonomous vehicle. Remote assistance tasks may also include the human operator providing an instruction to control operation of the vehicle (e.g., instruct the vehicle to stop at a stop sign if the human operator determines that the object is a stop sign), although in some scenarios, the vehicle itself may control its own operation based on the human operator's feedback related to the identification of the object.

To facilitate this, the vehicle may analyze the environment data representing objects of the surrounding environment to determine at least one object having a detection confidence below a threshold. A processor in the vehicle may be configured to detect various objects of the surrounding environment based on environment data from various sensors. For example, in one embodiment, the processor may be configured to detect objects that may be important for the vehicle to recognize. Such objects may include pedestrians, bicyclists, street signs, other vehicles, indicator signals on other vehicles, and other various objects detected in the captured environment data.

The detection confidence may be indicative of a likelihood that the determined object is correctly identified in the surrounding environment, or is present in the surrounding environment. For example, the processor may perform object detection of objects within image data in the received environment data, and determine that at least one object has the detection confidence below the threshold based on being unable to identify the object with a detection confidence above the threshold. If a result of an object detection or object recognition of the object is inconclusive, then the detection confidence may be low or below the set threshold.

The vehicle may detect objects of the surrounding environment in various ways depending on the source of the environment data. In some embodiments, the environment data may come from a camera and be image or video data. In other embodiments, the environment data may come from a lidar. The vehicle may analyze the captured image or video data to identify objects in the image or video data. The methods and apparatuses may be configured to monitor image and/or video data for the presence of objects of the surrounding environment. In other embodiments, the environment data may be radar, audio, or other data. The vehicle may be configured to identify objects of the surrounding environment based on the radar, audio, or other data.

In some embodiments, the techniques the vehicle uses to detect objects may be based on a set of known data. For example, data related to environmental objects may be stored to a memory located in the vehicle. The vehicle may compare received data to the stored data to determine objects. In other embodiments, the vehicle may be configured to determine objects based on the context of the data. For example, street signs related to construction may generally have an orange color. Accordingly, the vehicle may be configured to detect objects that are orange, and located near the side of roadways as construction-related street signs. Additionally, when the processing system of the vehicle detects objects in the captured data, it also may calculate a confidence for each object.

Further, the vehicle may also have a confidence threshold. The confidence threshold may vary depending on the type of object being detected. For example, the confidence threshold may be lower for an object that may require a quick responsive action from the vehicle, such as brake lights on another vehicle. However, in other embodiments, the confidence threshold may be the same for all detected objects. When the confidence associated with a detected object is greater than the confidence threshold, the vehicle may assume the object was correctly recognized and responsively adjust the control of the vehicle based on that assumption.

When the confidence associated with a detected object is less than the confidence threshold, the actions that the vehicle takes may vary. In some embodiments, the vehicle may react as if the detected object is present despite the low confidence level. In other embodiments, the vehicle may react as if the detected object is not present.

When the vehicle detects an object of the surrounding environment, it may also calculate a confidence associated with the specific detected object. The confidence may be calculated in various ways depending on the embodiment. In one example, when detecting objects of the surrounding environment, the vehicle may compare environment data to predetermined data relating to known objects. The closer the match between the environment data and the predetermined data, the higher the confidence. In other embodiments, the vehicle may use mathematical analysis of the environment data to determine the confidence associated with the objects.

In response to determining that an object has a detection confidence that is below the threshold, the vehicle may transmit, to the remote computing system, a request for remote assistance with the identification of the object. As discussed above, the remote computing system may take various forms. For example, the remote computing system may be a computing device within the vehicle that is separate from the vehicle, but with which a human operator can interact while a passenger or driver of the vehicle, such as a touchscreen interface for displaying remote assistance information. Additionally or alternatively, as another example, the remote computing system may be a remote computer terminal or other device that is located at a location that is not near the vehicle.

The request for remote assistance may include the environment data that includes the object, such as image data, audio data, etc. The vehicle may transmit the environment data to the remote computing system over a network (e.g., network 304), and in some embodiments, via a server (e.g., server computing system 306). The human operator of the remote computing system may in turn use the environment data as a basis for responding to the request.

In some embodiments, when the object is detected as having a confidence below the confidence threshold, the object may be given a preliminary identification, and the vehicle may be configured to adjust the operation of the vehicle in response to the preliminary identification. Such an adjustment of operation may take the form of stopping the vehicle, switching the vehicle to a human-controlled mode, changing a velocity of the vehicle (e.g., a speed and/or direction), among other possible adjustments.

In other embodiments, even if the vehicle detects an object having a confidence that meets or exceeds the threshold, the vehicle may operate in accordance with the detected object (e.g., come to a stop if the object is identified with high confidence as a stop sign), but may be configured to request remote assistance at the same time as (or at a later time from) when the vehicle operates in accordance with the detected object.

Figure 4A:
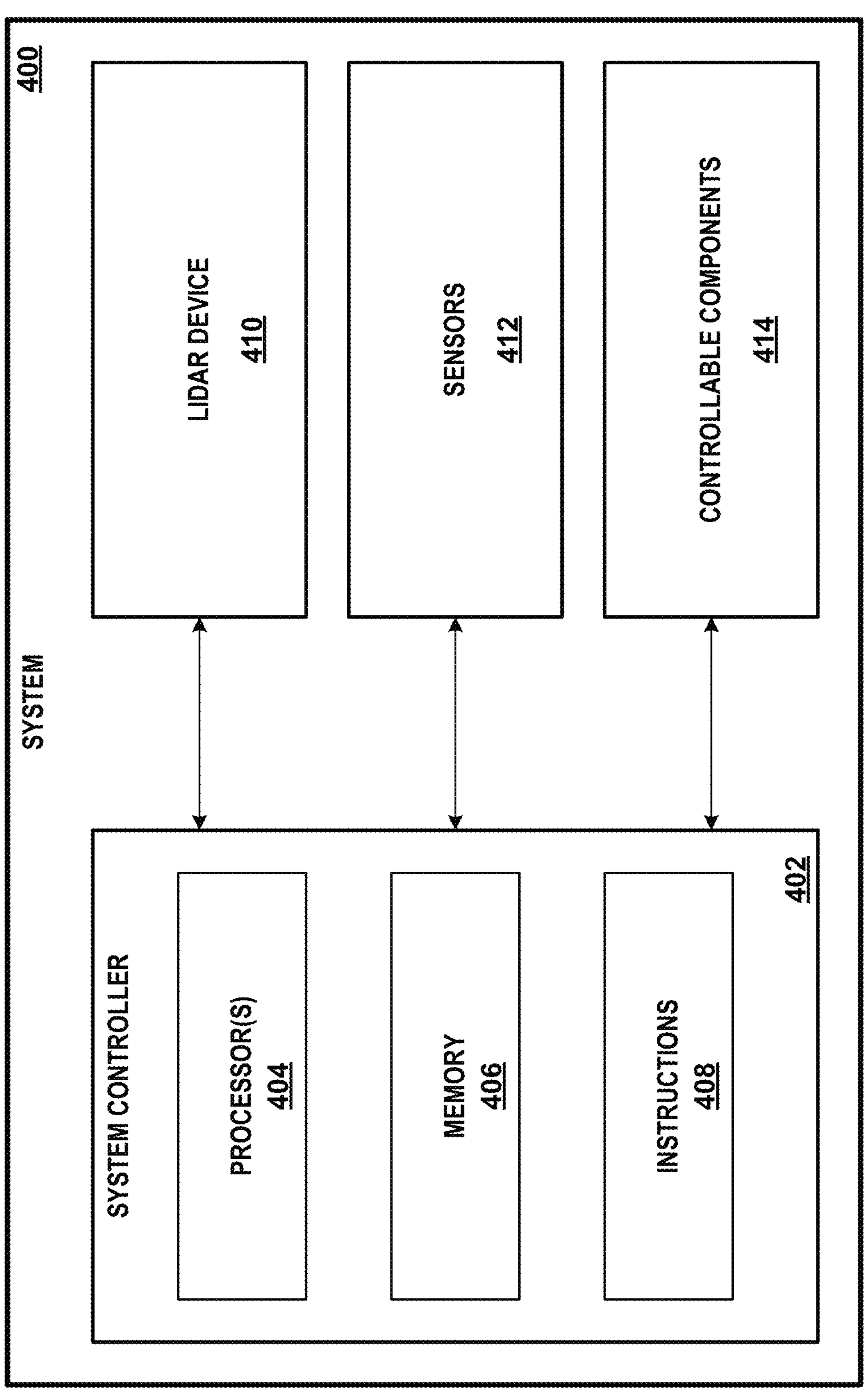
FIG. 4A is a block diagram of a system including a lidar device, according to example embodiments.

FIG. 4A is a block diagram of a system, according to example embodiments. In particular, FIG. 4A shows a system 400 that includes a system controller 402, a lidar device 410, a plurality of sensors 412, and a plurality of controllable components 414. System controller 402 includes processor(s) 404, a memory 406, and instructions 408 stored on the memory 406 and executable by the processor(s) 404 to perform functions.

The processor(s) 404 can include one or more processors, such as one or more general-purpose microprocessors (e.g., having a single core or multiple cores) and/or one or more special purpose microprocessors. The one or more processors may include, for instance, one or more central processing units (CPUs), one or more microcontrollers, one or more graphical processing units (GPUs), one or more tensor processing units (TPUs), one or more ASICs, and/or one or more field-programmable gate arrays (FPGAs). Other types of processors, computers, or devices configured to carry out software instructions are also contemplated herein.

The memory 406 may include a computer-readable medium, such as a non-transitory, computer-readable medium, which may include without limitation, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

The lidar device 410, described further below, includes a plurality of light emitters configured to emit light (e.g., in light pulses) and one or more light detectors configured to detect light (e.g., reflected portions of the light pulses). The lidar device 410 may generate three-dimensional (3D) point cloud data from outputs of the light detector(s), and provide the 3D point cloud data to the system controller 402. The system controller 402, in turn, may perform operations on the 3D point cloud data to determine the characteristics of a surrounding environment (e.g., relative positions of objects within a surrounding environment, edge detection, object detection, or proximity sensing).

Similarly, the system controller 402 may use outputs from the plurality of sensors 412 to determine the characteristics of the system 400 and/or characteristics of the surrounding environment. For example, the sensors 412 may include one or more of a GPS, an IMU, an image capture device (e.g., a camera), a light sensor, a heat sensor, and other sensors indicative of parameters relevant to the system 400 and/or the surrounding environment. The lidar device 410 is depicted as separate from the sensors 412 for purposes of example, and may be considered as part of or as the sensors 412 in some examples.

Based on characteristics of the system 400 and/or the surrounding environment determined by the system controller 402 based on the outputs from the lidar device 410 and the sensors 412, the system controller 402 may control the controllable components 414 to perform one or more actions. For example, the system 400 may correspond to a vehicle, in which case the controllable components 414 may include a braking system, a turning system, and/or an accelerating system of the vehicle, and the system controller 402 may change aspects of these controllable components based on characteristics determined from the lidar device 410 and/or sensors 412 (e.g., when the system controller 402 controls the vehicle in an autonomous or semi-autonomous mode). Within examples, the lidar device 410 and the sensors 412 are also controllable by the system controller 402.

Figure 4B:
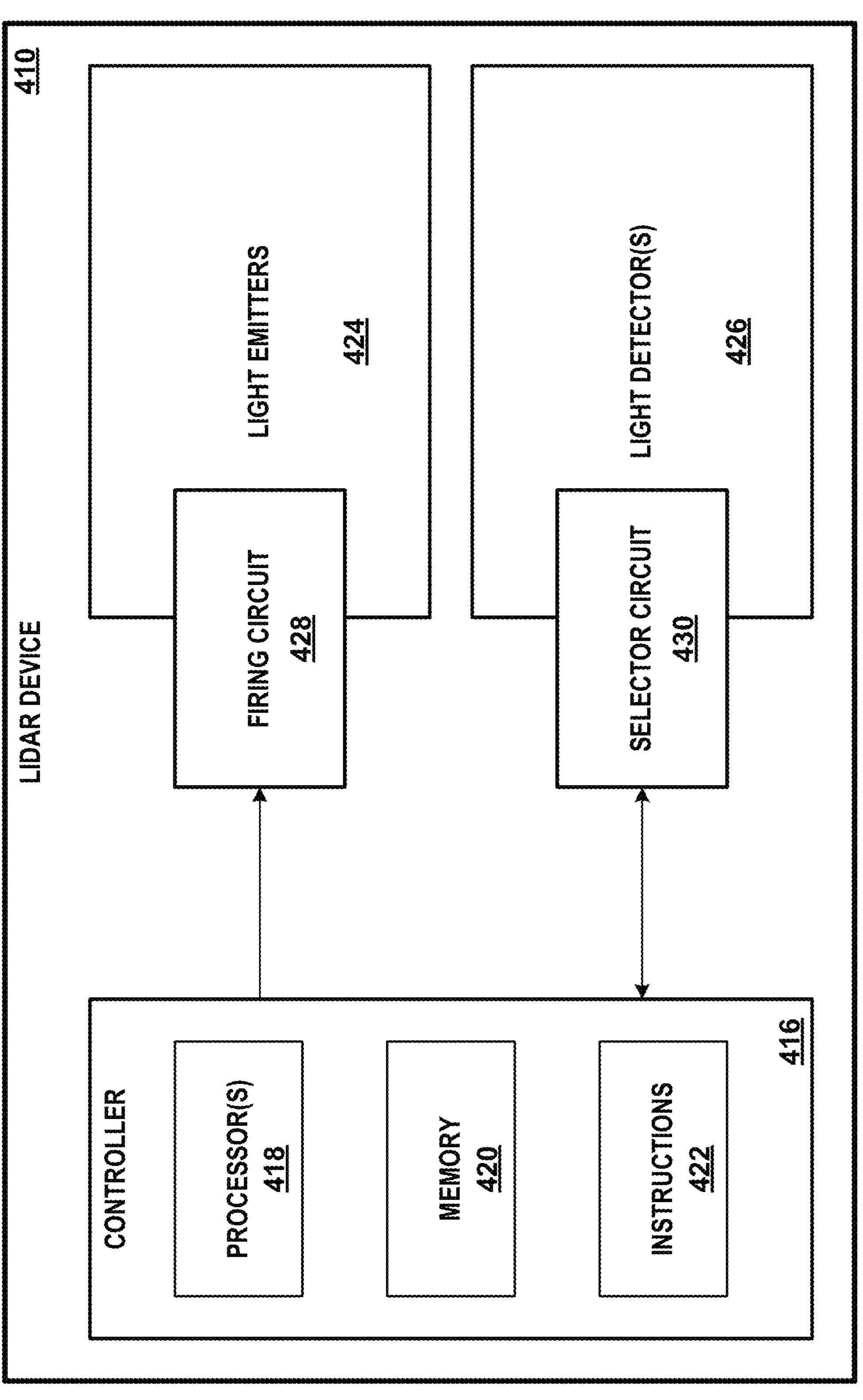
FIG. 4B is a block diagram of a lidar device, according to example embodiments.

FIG. 4B is a block diagram of a lidar device, according to an example embodiment. In particular, FIG. 4B shows a lidar device 410, having a controller 416 configured to control a plurality of light emitters 424 and one or more light detector(s), e.g., a plurality of light detectors 426, etc. The lidar device 410 further includes a firing circuit 428 configured to select and provide power to respective light emitters of the plurality of light emitters 424 and may include a selector circuit 430 configured to select respective light detectors of the plurality of light detectors 426. The controller 416 includes processor(s) 418, a memory 420, and instructions 422 stored on the memory 420.

Similar to processor(s) 404, the processor(s) 418 can include one or more processors, such as one or more general-purpose microprocessors and/or one or more special purpose microprocessors. The one or more processors may include, for instance, one or more CPUs, one or more microcontrollers, one or more GPUs, one or more TPUs, one or more ASICs, and/or one or more FPGAs. Other types of processors, computers, or devices configured to carry out software instructions are also contemplated herein.

Similar to memory 406, the memory 420 may include a computer-readable medium, such as a non-transitory, computer-readable medium, such as, but not limited to, ROM, PROM, EPROM, EEPROM, non-volatile random-access memory (e.g., flash memory), a SSD, a HDD, a CD, a DVD, a digital tape, R/W CDs, R/W DVDs, etc.

The instructions 422 are stored on memory 420 and executable by the processor(s) 418 to perform functions related to controlling the firing circuit 428 and the selector circuit 430, for generating 3D point cloud data, and for processing the 3D point cloud data (or perhaps facilitating processing the 3D point cloud data by another computing device, such as the system controller 402).

The controller 416 can determine 3D point cloud data by using the light emitters 424 to emit pulses of light. A time of emission is established for each light emitter and a relative location at the time of emission is also tracked. Aspects of a surrounding environment of the lidar device 410, such as various objects, reflect the pulses of light. For example, when the lidar device 410 is in a surrounding environment that includes a road, such objects may include vehicles, signs, pedestrians, road surfaces, or construction cones. Some objects may be more reflective than others, such that an intensity of reflected light may indicate a type of object that reflects the light pulses. Further, surfaces of objects may be at different positions relative to the lidar device 410, and thus take more or less time to reflect portions of light pulses back to the lidar device 410. Accordingly, the controller 416 may track a detection time at which a reflected light pulse is detected by a light detector and a relative position of the light detector at the detection time. By measuring time differences between emission times and detection times, the controller 416 can determine how far the light pulses travel prior to being received, and thus a relative distance of a corresponding object. By tracking relative positions at the emission times and detection times the controller 416 can determine an orientation of the light pulse and reflected light pulse relative to the lidar device 410, and thus a relative orientation of the object. By tracking intensities of received light pulses, the controller 416 can determine how reflective the object is. The 3D point cloud data determined based on this information may thus indicate relative positions of detected reflected light pulses (e.g., within a coordinate system, such as a Cartesian coordinate system) and intensities of each reflected light pulse.

The firing circuit 428 is used for selecting light emitters for emitting light pulses. The selector circuit 430 similarly is used for sampling outputs from light detectors.

Figure 5:
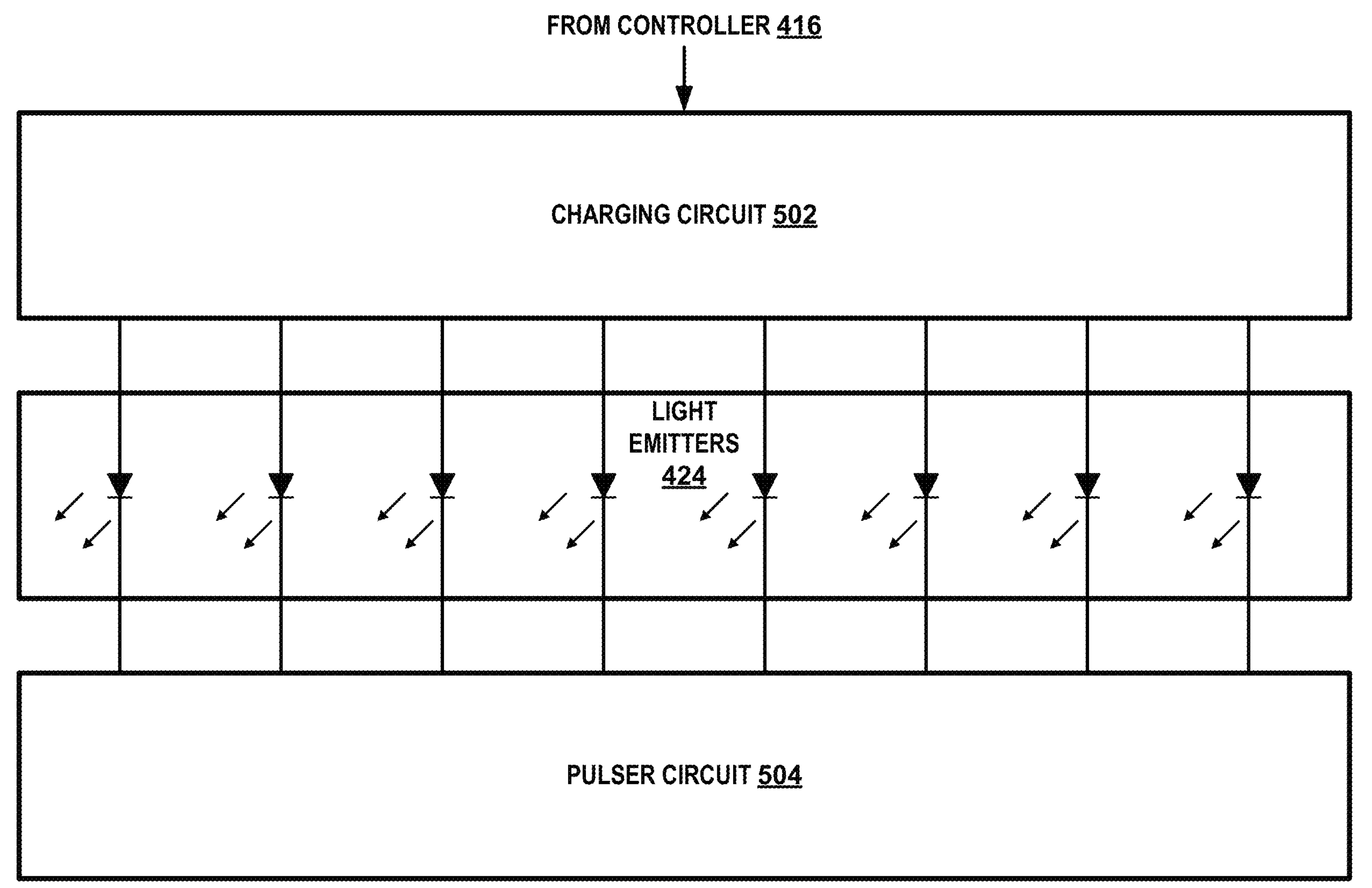
FIG. 5 is a schematic illustration of a firing circuit and light emitters, according to example embodiments.

FIG. 5 is a schematic illustration of a firing circuit (e.g., the firing circuit 428 shown and described with reference to FIG. 4B) and light emitters (e.g., the light emitters 424 shown and described with reference to FIG. 4B). The firing circuit 428 may include a charging circuit 502 and a pulser circuit 504.

The charging circuit 502 (e.g., a processor of the charging circuit) may receive (e.g., from the controller 416 of the lidar device, as illustrated) an indication of a first set of light emitters to be fired during the firing cycle. For example, one or more electrical signals that indicate which light emitters are to be fired during the firing cycle may be transmitted to the charging circuit 502 (e.g., over an SPI). Based on the indication of the first set of light emitters to be fired, the charging circuit 502 may then charge a first set of energy storage devices (e.g., within the charging circuit 502). For example, the charging circuit 502 may charge a first set of capacitors to a predefined firing voltage, using a predefined current, and/or over a predefined charging time. The charging circuit 502 may also refrain from charging a set of energy storage devices that are not in the first set of energy storage devices.

Once the energy storage devices in the first set of energy storage devices have been charged, the pulser circuit may cause (e.g., using a processor of the pulser circuit or based on an instruction from a processor of the charging circuit) energy stored in the first set of energy storage devices to be discharged through light emitters (e.g., laser diodes) associated with the first set of energy storage devices. For example, the pulser circuit may switchably connect (e.g., using a MOSFET) a cathode of a light emitter (e.g., a laser diode) to ground while the anode of the light emitter is connected to a terminal of the corresponding energy storage device, which may result in current flowing through the light emitter (i.e., the energy in the energy storage device is discharged through the light emitter). When energy is discharged through the light emitters, the light emitters may be configured to emit one or more light signals (e.g., laser pulses). The intensity of a light signal emitted by a given light emitter may depend on how much current passes through the light emitter, which can in turn depend on a charge level of a corresponding energy storage device. The charge level of the corresponding energy storage device may depend on the storage capacity (e.g., capacitance) of the energy storage device of the respective channel associated with the light emitter, the charging time used to charge the energy storage device of the respective channel associated with the light emitter, and/or the charging voltage used to charge the energy storage device of the respective channel associated with the light emitter. Accordingly, adjusting any of these charging conditions for the energy storage device can be used to determine the intensity and/or duration of light signals that will be emitted by a given light emitter when the charge storage device discharges.

In order to monitor and/or adjust the intensity and/or duration of light signals emitted by the light emitters, the charging circuit 502 may include one or more voltage monitors (e.g., each of which may include a voltage divider and a comparator) that output signals indicative of the charge level of a corresponding energy storage device. Further, a processor of the charging circuit 502 can receive an output of the voltage monitor in order to monitor the charge status of a given energy storage device. The processor of the charging circuit 502 may further cause a predetermined amount of energy to be stored in an energy storage device during a charging cycle (e.g., may cease charging once the charge level reaches a predefined value). Such a predetermined amount of energy may result in a light emitter emitting a light signal during a firing cycle with a desired intensity.

It is understood that charging circuits 502 and pulser circuits 504 as described herein may take various forms. As such, FIGS. 6A-8G provide illustrations (e.g., schematic illustrations) of some example embodiments of the charging circuits 502 and pulser circuits 504.

Figure 6A:
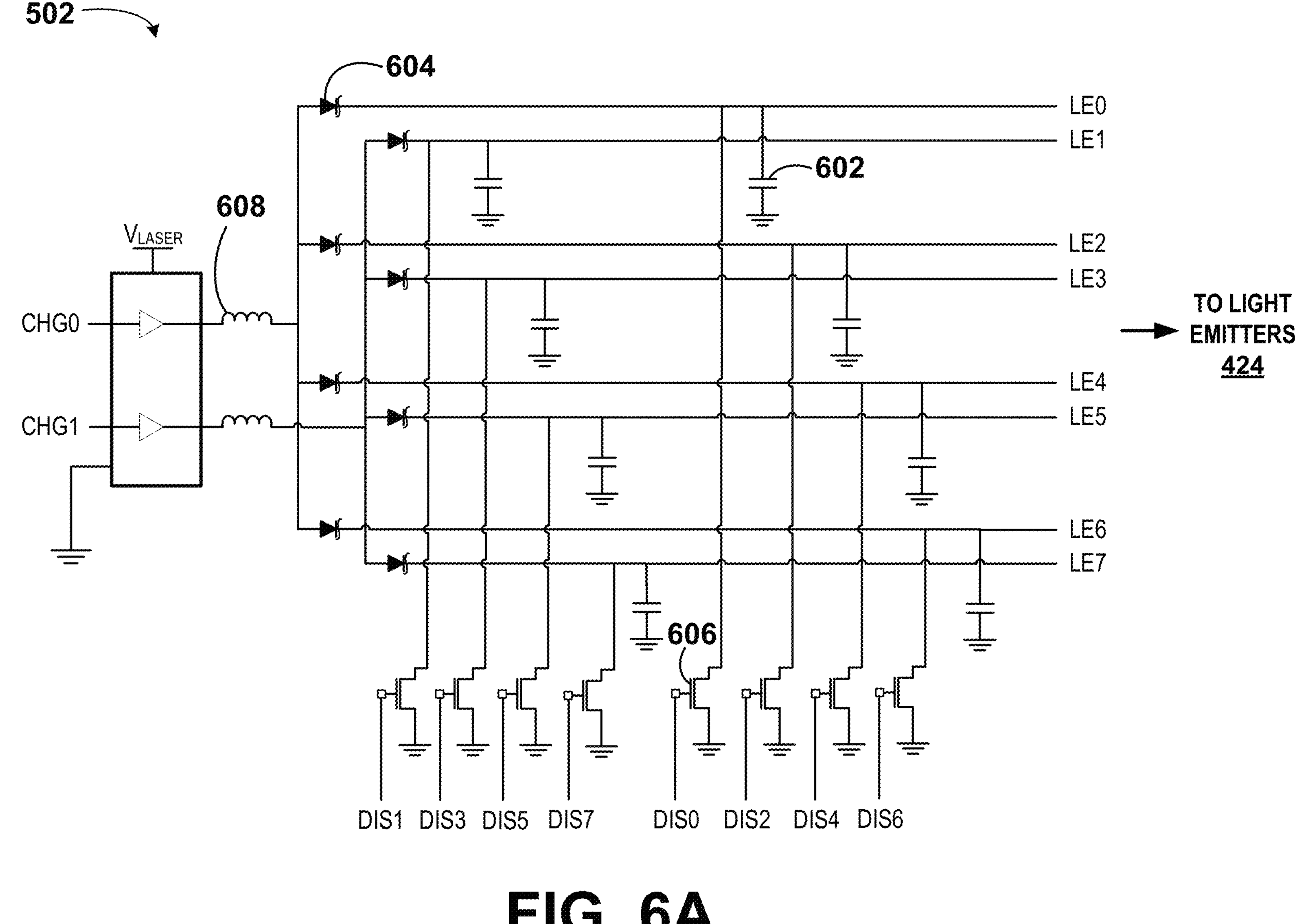
FIG. 6A is a circuit diagram illustrating a charging circuit, according to example embodiments.

FIG. 6A is a circuit diagram illustrating a charging circuit (e.g., the charging circuit 502 shown and described with reference to FIG. 5), according to example embodiments. As illustrated, the charging circuit 502 may include a series of channels whose outputs are respectively connected to light emitters (e.g., the light emitters 424 shown and described with reference to FIGS. 4B and 5). Such outputs are labeled as LE0 through LE7 in FIG. 6A. While FIG. 6A includes eight channels, it is understood that this is presented solely as an example and that other numbers of channels (e.g., one channel, two channels, three channels, four channels, five channels, six channels, seven channels, nine channels, ten channels, and eleven channels) are also possible and are contemplated herein.

As illustrated, each channel may include an energy storage device 602 and a diode 604 (e.g., a Schottky diode). In order to avoid cluttering the illustration, only the energy storage device 602 and the diode 604 of a single channel are labeled in FIG. 6A. The energy storage device 602 may include a capacitor (e.g., a silicon capacitor or an MLCC) having a given capacitance (e.g., a capacitance between 0.1 nF and 10 nF). As illustrated, one terminal of the energy storage device 602 may be connected to ground while the other terminal is connected to the output that leads to a light emitter 424 of the channel (e.g., LE0). As also illustrated, the terminal of the energy storage device 602 that is connected to the output that leads to the light emitter 424 of the channel may also be connected to a cathode of the diode 604 of the channel and to a first terminal (e.g., a source) of a switch 606 (e.g., a MOSFET). Like above, in order to avoid cluttering the illustration, only a single switch 606 has been labeled in FIG. 6A. As illustrated, a second terminal (e.g., a drain) of the switch 606 may be connected to ground and a third terminal (e.g., a gate) of the switch 606 may be connected to a selection signal (labeled as DIS0 through DIS7 in FIG. 6A).

As described above, the energy storage device 602 may be selectively charged according to an indication provided to the charging circuit 502 (e.g., by a lidar controller 416). Thereafter, the light emitter 424 in the same channel as the energy storage device 602 may be fired by discharging the energy stored in the energy storage device 602. In order to selectively charge the energy storage devices 602 of the charging circuit 502, the energy storage devices 602 may be grouped into subsets (e.g., subsets of two energy storage devices, subsets of three energy storage devices, subsets of four energy storage devices, etc.). For example, as illustrated in FIG. 6A, the energy storage devices 602 may be grouped into sets of four energy storage devices 602 (e.g., channels 0, 2, 4, and 6 and channels 1, 3, 5, and 7 are each grouped together). Each of the groupings may be connected to a common node (e.g., at an output from a processor of the charging circuit 502). For example, as illustrated in FIG. 6A, the anodes of the diodes 604 in each grouping may be attached to a single node that is connected to one terminal of an inductor 608 of the charging circuit 502. Like above, in order to avoid cluttering the illustration, only a single inductor 608 has been labeled in FIG. 6A. The other terminal of the inductor 608 may be connected to an output of a processor of the charging circuit 502. As illustrated in FIG. 6A, each of the two sets of four channels are connected to a respective input (e.g., CHG0 and CHG1). These inputs may receive the indications of which channels are to be fired from another device (e.g., the lidar controller 416 shown and described with reference to FIG. 4B). The combination of the inductor 608 and the diode 604 (e.g., along with the energy storage device 602) may increase the charging efficiency compared to circuit topologies without the inductor 608 and/or diode 604. For example, the inductance of the inductor 608 and/or the capacitance of an energy storage device 602 (e.g., when the energy storage device 602 is a capacitor) may be tuned to adjust a resonant frequency of the circuit to a charging/discharging frequency that will be used during operation. Additionally, by including the inductor 608 in the charging circuit 502, the energy efficiency of the process of charging the energy storage devices 602 can be enhanced. For example, the energy that may be dissipated in a resistive portion of a circuit as a result of a current flowing therethrough (i.e., $I^2R$ loss) may be mitigated by inclusion of the inductor 608 in the charging circuit 502.

If at least one of the light emitters 424 in a grouping of four channels is to be fired during a firing cycle, the corresponding energy storage device 602 may be charged during the corresponding charging cycle. For example, if the light emitter 424 connected to LE0 (i.e., the light emitter 424 of channel 0) is to be fired during a firing cycle, the energy storage device 602 of channel 0 may be charged during the corresponding charging cycle. Likewise, if the light emitter 424 connected to LE6 is to be fired during a firing cycle, the energy storage device 602 of channel 6 may be charged during the corresponding charging cycle. However, assuming the light emitters 424 connected to LE2 and LE4 are to refrain from firing during a firing cycle, the energy storage devices 602 of channels 2 and 4 may refrain from charging during the corresponding charging cycle. In this example, because at least one of the energy storage devices 602 in the group of four (e.g., channels 0, 2, 4, and 6) is to be charged during the charging cycle, the input (e.g., from CHG0) may be high (e.g., may supply a voltage corresponding to VLASER).

Using the high input, each of the energy storage devices 602 in the group of four could theoretically be charged during the charging cycle. However, in order to refrain from charging the energy storage devices 602 in channels 2 and 4 (based on the example above) such that the light emitters connected to LE2 and LE4 are not fired during a subsequent firing cycle, corresponding switches 606 of channels 2 and 4 may be closed during the charging cycle. In order to cause the switches 606 of channels 2 and 4 to be closed, a controller (e.g., a processor of the charging circuit 502 based on an indication from the lidar controller 416) may set the signals of DIS2 and DIS4 to high, thereby engaging the switches. By engaging the switches 606 of channels 2 and 4, both terminals of the energy storage devices 602 in channels 2 and 4 may be connected to ground. Hence, even though the set of four energy storage devices 602 in the group may be supplied with a charging voltage (e.g., VLASER), the energy storage devices 602 in channels 2 and 4 may be effectively deselected (i.e., deactivated) and, therefore, refrain from charging during the charging cycle.

A similar technique could be used to charge a subset of energy storage devices 602 corresponding to channels 1, 3, 5, and 7. Additionally, if none of the energy storage devices 602 in a group (e.g., in channels 1, 3, 5, and 7) are to be charged during a charging cycle, an input (e.g., CHG1) may simply be set low (e.g., rather than setting CHG1 to high and subsequently deselecting every channel using inputs DIS1, DIS3, DIS5, and DIS7). It is understood that the techniques described above are provided solely as examples and that the charging of other sets of channels within the set of eight channels illustrated in FIG. 6A during a firing cycle is also possible using analogous techniques. Further, it is understood that similar techniques are also contemplated herein involving different numbers of channels and/or different numbers of channels within groupings. The arrangement of FIG. 6A may also be used to prevent reverse current leakage (e.g., from the light emitters 424 during a firing cycle) from inadvertently charging undesirable energy storage devices 602. For example, the switches 606 corresponding to energy storage devices 602 that are not being used during a firing cycle could be opened so as to allow any incidental current leakage to flow to ground (e.g., as opposed to undesirable energy storage devices 602).

Figure 6B:
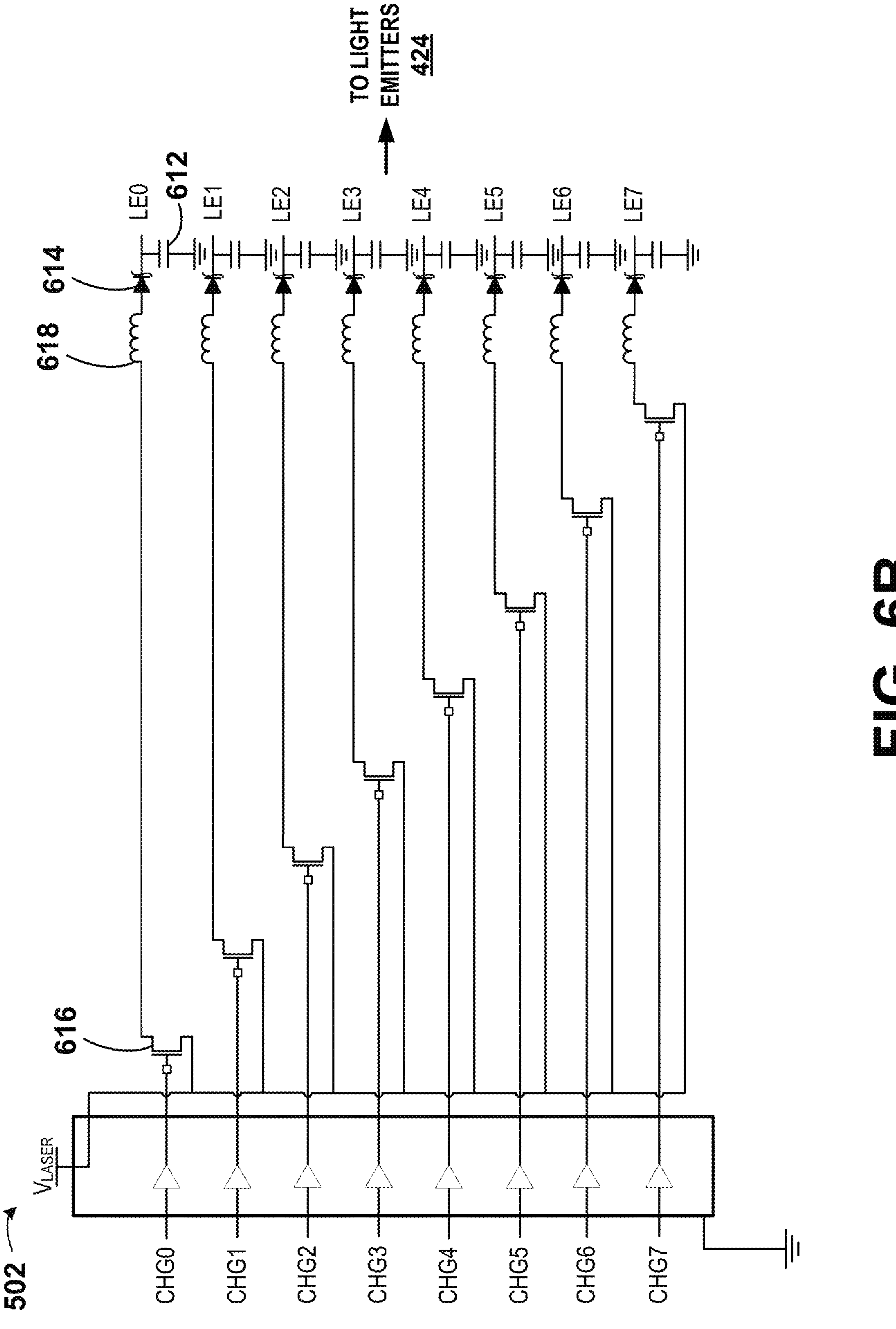
FIG. 6B is a circuit diagram illustrating a charging circuit, according to example embodiments.

FIG. 6B is a circuit diagram illustrating another charging circuit (e.g., the charging circuit 502 shown and described with reference to FIG. 5), according to example embodiments. Similar to FIG. 6A, the charging circuit 502 example of FIG. 6B includes eight channels, each of which includes an energy storage device 612, a diode 614, a switch 616 (e.g., a MOSFET), and an inductor 618. Further, a terminal of each of the energy storage devices 612 is connected to an output (LE0 through LE7) that leads to one of the light emitters 424. As illustrated, a first terminal (e.g., a source) of each of the switches 616 may be connected to a supply voltage (e.g., VLASER), a second terminal (e.g., a drain) of each of the switches 616 may be connected to a terminal of the energy storage device 612 of the corresponding channel via the inductor 618 and the diode 614 of the corresponding channel, and a third terminal (e.g., a gate) of each of the switches 616 may be connected to an output of a controller (e.g., a processor of the charging circuit 502).

Using the arrangement of FIG. 6B, each switch 616 can be used to supply or refrain from supplying charging voltage to the energy storage device 612 of the respective channel. For example, when the switch 616 of channel 0 is closed (e.g., based on the signal CHG0 being high) during a charging cycle, a charging voltage (e.g., VLASER) will be supplied to the energy storage device 612 of channel 0. Likewise, when the switch 616 of channel 0 is open (e.g., based on the signal CHG0 being low) during a charging cycle, the charging circuit 502 will refrain from supplying a charging voltage to the energy storage device 612 of channel 0. Using a similar strategy across all of the channels, a set of selected energy storage devices 612 can be charged during a charging cycle. Then, subsequently, a set of corresponding light emitters 424 can be fired during a corresponding firing cycle. The arrangement illustrated in FIG. 6B may provide enhanced energy efficiency compared to arrangements where each energy storage device is initially charged and then those which correspond to light emitters that are not to be fired during a firing cycle are selectively discharged prior to the firing cycle (e.g., because the arrangement of FIG. 6B may prevent the unnecessary energy loss involved in charging and discharging energy storage devices that are not needed for firing).

Which switches 616 are closed and, consequently, which energy storage devices 612 are charged can be based on channel selection signals (e.g., CHG0 through CHG7, as illustrated in FIG. 6B). Such signals may be based on an indication (e.g., sent by a lidar controller 416 over an SPI) of a first set of light emitters 424 to be fired during a firing cycle. The charging circuit 502 (e.g., a processor of the charging circuit 502) may take this indication and then provide appropriate channel selection signals to charge the energy storage devices 612 that correspond to the first set of light emitters 424 (e.g., are in the same channels as the first set of light emitters 424). Alternatively, the lidar controller 416 may provide the indication of which light emitters 424 are to be fired during a firing cycle by providing the channel selection signals directly (e.g., without use of a processor of a charging circuit 502).

Figure 6C:
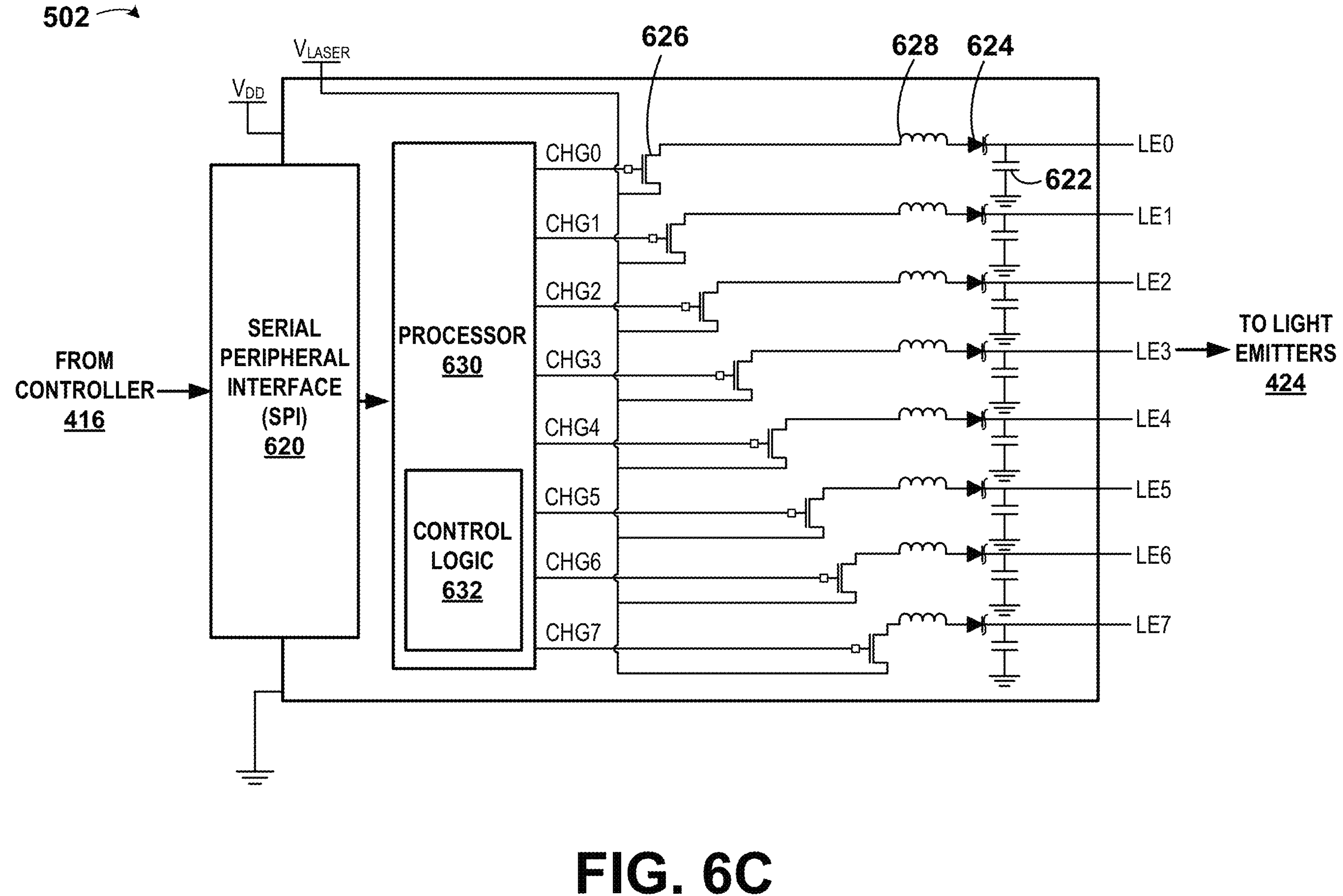
FIG. 6C is a circuit diagram illustrating a charging circuit, according to example embodiments.

FIG. 6C is a circuit diagram illustrating another charging circuit (e.g., the charging circuit 502 shown and described with reference to FIG. 5), according to example embodiments. Similar to FIGS. 6A and 6B, the charging circuit 502 example of FIG. 6C includes eight channels, each of which includes an energy storage device 622, a diode 624, a switch 626 (e.g., a MOSFET), and an inductor 628. Further, a terminal of each of the energy storage devices 622 is connected to an output (LE0 through LE7) that leads to one of the light emitters 424. As illustrated, a first terminal (e.g., a source) of each of the switches 626 may be connected to a supply voltage (e.g., VLASER), a second terminal (e.g., a drain) of each of the switches 626 may be connected to a terminal of the energy storage device 622 of the corresponding channel via the inductor 628 and the diode 624 of the corresponding channel, and a third terminal (e.g., a gate) of each of the switches 626 may be connected to an output of a controller (e.g., a processor of the charging circuit 502).

As illustrated, each of the switches 626 in the array of switches 626 may be arranged as high-side switches for their respective channels. In various embodiments, the switches 626 may be components of a solenoid driver (e.g., an octal solenoid driver, a serial-controlled solenoid driver, or an integrated serial-controlled solenoid driver), a MOSFET driver, an H-bridge driver, a motor driver, an LED driver, or a multiplexer or may be a plurality of load switches. In some embodiments (e.g., embodiments using a serial-controlled driver for the switches 626), the switches 626 may be operated without the use of an additional controller (e.g., without the inclusion of the processor 630) of the charging circuit 502. In other words, in some embodiments (e.g., embodiments using a serial-controlled driver for the switches 626), the SPI 620 may be connected directly to the switches 626.

Using the arrangement of FIG. 6C, each switch 626 can be used to supply or refrain from supplying charging voltage to the energy storage device 622 of the respective channel. For example, when the switch 626 of channel 2 is closed (e.g., based on the signal CHG2 being high) during a charging cycle, a charging voltage (e.g., VLASER) will be supplied to the energy storage device 622 of channel 2. Likewise, when the switch 626 of channel 2 is open (e.g., based on the signal CHG2 being low) during a charging cycle, the charging circuit 502 will refrain from supplying a charging voltage to the energy storage device 622 of channel 2. Using a similar strategy across all of the channels, a set of selected energy storage devices 622 can be charged during a charging cycle. Then, subsequently, a set of corresponding light emitters 424 can be fired during a corresponding firing cycle.

Which switches 626 are closed and, consequently, which energy storage devices 622 are charged can be based on channel selection signals (e.g., CHG0 through CHG7, as illustrated in FIG. 6C). Such signals may be based on an indication (e.g., sent by a lidar controller 416 over an SPI 620) of a first set of light emitters 424 to be fired during a firing cycle. The charging circuit 502 (e.g., a processor 630 of the charging circuit 502) may receive this indication via the SPI 620 and then provide appropriate channel selection signals to charge the energy storage devices 622 that correspond to the first set of light emitters 424 (e.g., are in the same channels as the first set of light emitters 424). While the embodiment illustrated in FIG. 6C includes the SPI 620, it is understood that other interfaces are also possible and are contemplated herein. For example, a low-voltage differential signaling (LVDS) interface (e.g., to enhance communication speed) and/or another digital communication bus could be used.

In order to provide appropriate channel selection signals, the processor 630 of the charging circuit 502 may execute control logic 632 (e.g., stored within a memory internal to or external to the processor 630). Additionally, in some embodiments the processor 630 may include and/or be a component of a FPGA. Further, such an FPGA may also include the control logic 632 and/or the SPI 620. In various embodiments, the processor 630, the control logic 632, the SPI 620, the switches 626, the inductors 628, the diodes 624, and/or the energy storage devices 622 may include and/or be components of an ASIC. Regardless of whether an FPGA and/or an ASIC is used for some or all of the components of the charging circuit 502, though, one or more of the components of the charging circuit 502 may be arranged on and/or mounted to a PCB.

Figure 7:
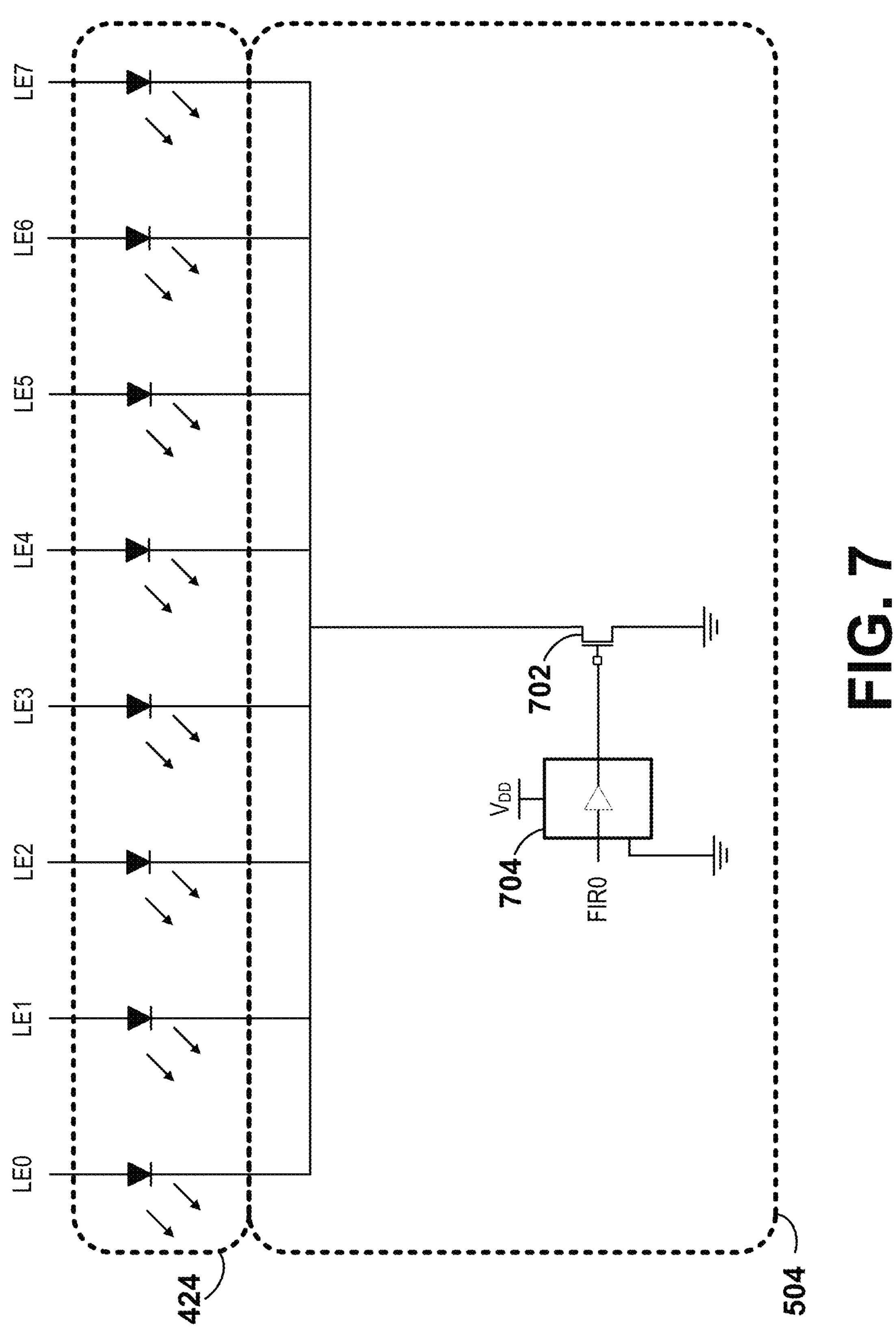
FIG. 7 is a circuit diagram illustrating a pulser circuit and light emitters, according to example embodiments.

FIG. 7 is a circuit diagram illustrating a pulser circuit 504, according to example embodiments. FIG. 7 also illustrates the connection of the pulser circuit 504 to the light emitters 424. As shown and described with reference to FIGS. 5-6C, the light emitters 424 may be connected to the outputs of the charging circuit 502 on a channel-by-channel basis. For example, as illustrated in FIG. 7, there may be eight light emitters 424 and each light emitter 424 may receive an input signal (e.g., labeled LE0 through LE7) that was output by the charging circuit 502.

The pulser circuit 504 may control the discharge of one or more charged energy storage devices (e.g., the energy storage devices 602, 612, 622 shown and described with reference to FIGS. 6A-6C) to emit light signals (e.g., light pulses) from the one or more corresponding light emitters 424 (e.g., laser diodes). As illustrated, the pulser circuit 504 may include a switch 702 (e.g., a GaNFET, a limit switch, or another type of switching device). The switch 702 may be configured to allow or restrict current flow based on a control signal received from a FET driver 704 (e.g., which may receive instructions from the processor of the charging circuit 502, such as through signal FIR0). As shown in FIG. 7, when the switch 702 is open, a current might also not flow through the light emitters 424. Accordingly, when the switch 702 is open, the light emitters 424 may not emit light. By contrast, when the switch 702 is closed, current can flow through the light emitters 424 to ground, causing the light emitters 424 to emit light signals, as depicted in FIG. 7. The current flowing through a given light emitter 424 may be the result of a previously charged energy storage device 602, 612, 622 of the corresponding channel (e.g., charged by the charging circuit 502 during a charging cycle) discharging through the light emitter 424 (e.g., during a firing cycle). The intensity of light depends on a level of current flow through each respective light emitter 424, which in turn corresponds to a charge level in a current path of each respective light emitter 424.

As illustrated in FIG. 7, the pulser circuit 504 may include a single switch 702 used to fire all of the light emitters 424 that are in the same channel as charged energy storage devices 602, 612, 622 (i.e., fire all of the selected light emitters 424) simultaneously. It is understood that this is provided solely as an example embodiment and that other embodiments are also possible and contemplated herein. For example, in other embodiments the pulser circuit 504 may include a separate switch 702 and/or FET driver 704 for each channel. In still other embodiments, the light emitters 424 may be grouped into sets of four (e.g., like the energy storage devices 602 illustrated in FIG. 6A) and there may be a separate switch 702 and/or FET driver 704 for each of the groupings.

As described above, FIGS. 5-7 illustrate various embodiments of a firing circuit (e.g., the firing circuit 428 shown and described with reference to FIG. 4B) and the connections between the firing circuit 428 and the light emitters 424. Various physical implementations of the firing circuit 428 are possible and are contemplated herein. For example, the various charging circuits 502 shown and described with reference to FIGS. 6A-6C can be manufactured using a variety of techniques. FIGS. 8A-8G show a variety of arrangements of example charging circuits 502 and corresponding light emitters 424. Such charging circuits 502 and light emitters 424 may be arranged on one or more mounting surfaces of one or more PCBs. For example, the charging circuit 502 may be arranged across a plurality of PCB surfaces.

Figure 8A:
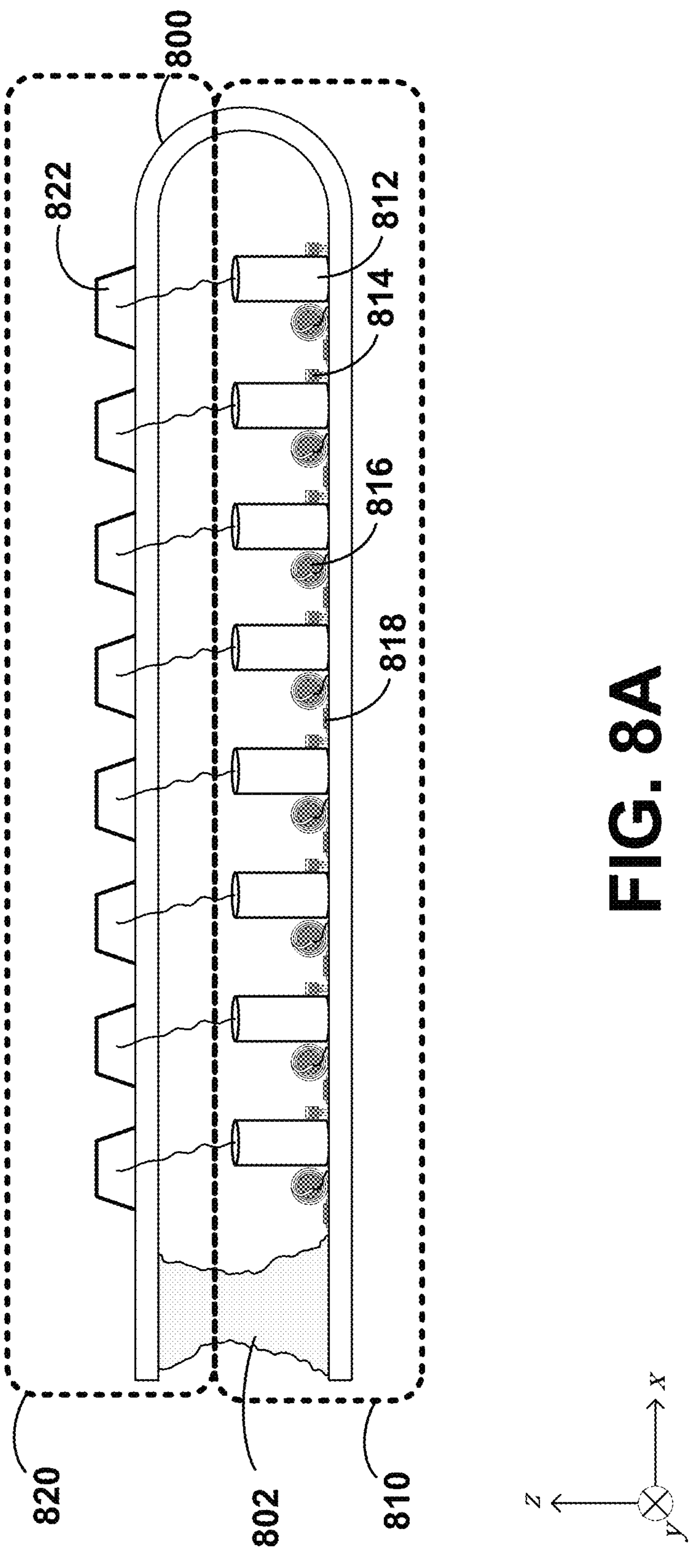
FIG. 8A is a side-view illustration of a charging circuit and associated light emitters, according to example embodiments.

FIG. 8A is a side-view illustration of a charging circuit and associated light emitters 822, according to example embodiments. Like the charging circuits 502 described with reference to FIGS. 6A-6C, the charging circuit of FIG. 8A may include energy storage devices 812 (e.g., capacitors), switches 814 (e.g., MOSFETs), inductors 816, and/or diodes 818 (e.g., Schottky diodes). As illustrated, the components of the charging circuit and the light emitters 822 may be disposed on surfaces of a PCB 800 (e.g., opposing surfaces of the PCB 800). In various embodiments, the PCB 800 may be a flexible PCB or a rigid-flex PCB. As also illustrated, the PCB 800 may have a three-dimensional structure. The three-dimensional structure may be the result of a bend along an axis that is perpendicular to one or more mounting surfaces of the PCB 800 (e.g., along the z-axis illustrated in FIG. 8A). The PCB 800 may be flexible in order to permit the bending along the z-axis.

For example, as shown in FIG. 8A, a 180° bend along the z-axis may result in a multi-story structure that includes a first story 810 and a second story 820. The first story 810 may include components of the charging circuit (e.g., the energy storage devices 812, the switches 814, the inductors 816, and the diodes 818) disposed along a first surface of the PCB 800, whereas the light emitters 822 may be disposed along a second surface of the PCB 800. In an unbent conformation, the first surface of the PCB 800 and the second surface of the PCB 800 may be on opposite sides of the PCB 800. Hence, in the bent conformation illustrated in FIG. 8A, the components on the second surface of the PCB 800 (e.g., located in the second story 820 of the PCB) may be vertically stacked above (e.g., parallel to) components on the first surface of the PCB 800 (e.g., located in the first story 810 of the PCB). As illustrated, the energy storage devices 812 may be connected to the light emitters 822 using wirebonds. It is understood that this is solely provided for illustration purposes and that other connections (e.g., between the energy storage devices 812 and the light emitters 822 and/or between other components) are also possible and are contemplated herein. For example, wire traces running along one or more surfaces of the PCB 800 and/or vias that pass through the PCB 800 could be used to electrically connect components of the charging circuit and/or the light emitters 822. Further, it is understood that the arrangement and type of components included in the charging circuit is purely illustrative and that additional or alternative components could also be used. For example, in some embodiments, the charging circuit may also include a processor, a SPI, a SPI controller, etc.

In order to stabilize and/or solidify the bent conformation illustrated in FIG. 8A, an adhesive 802 (e.g., glue) could be used to adhere the second story 820 to the first story 810. For example, as illustrated, a portion of the bottom surface of the second story 820 may be adhered to a portion of the top surface of the first story 810 to maintain the folded arrangement. Other adhering techniques for maintaining the bent conformation are also possible and are contemplated herein. In some embodiments, the entire structure may also be overmolded (e.g., in order to maintain the position of the components, in order to assist in heat transfer, and/or in order to provide mechanical support and/or protection).

Figures 8B, 8C:
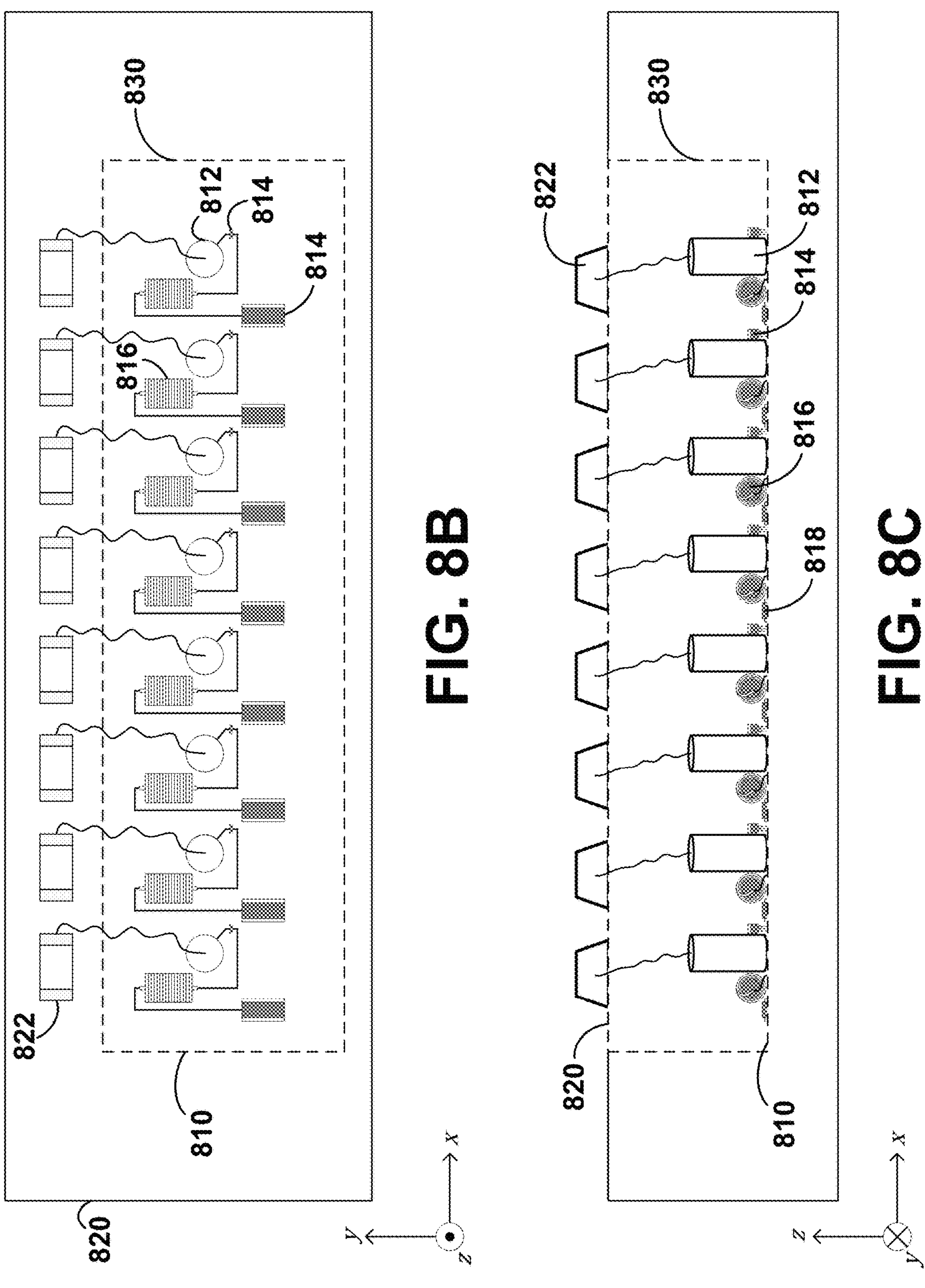
FIG. 8B is a top-view illustration of a charging circuit and associated light emitters, according to example embodiments.
FIG. 8C is a side-view illustration of a charging circuit and associated light emitters, according to example embodiments.

FIGS. 8B and 8C illustrate another multi-story arrangement of the charging circuit and the light emitters 822, in a top view and a side view, respectively. As illustrated, the first story 810 may be located in a recession 830 (i.e., a cavity or a depression) within the PCB 800. For example, the light emitters 822 may be mounted onto a surface that is within the second story 820 of the PCB 800. Further, a recession 830 may be defined in the PCB (e.g., using additive or subtractive technologies) so as to provide another surface for mounting. This additional surface may be below the surface of the second story 820 and, therefore, correspond to a first story 810. The components of the charging circuit (e.g., the energy storage devices 812, the switches 814, the inductors 816, and the diodes 818) may be disposed along the surface defining the first story 810 (e.g., defined within the recession 830). The connections between the components of the first story 810 and the second story 820 may be electrically connected using wirebonds on either or both of the surface of the first story 810 and the surface of the second story 820, vias through the PCB 800, and/or based on wire traces along one or more surfaces of the PCB 800.

In still other embodiments, in order to form a multi-story arrangement across a plurality of PCB surfaces, a plurality of different PCBs may be used. For example, the arrangement of FIG. 8D includes three stories: a first story 850, a second story 860, and a third story 870. The first story 850 may include a surface on a first PCB 852, the second story 860 may include a surface on a second PCB 862, and the third story may include a surface on a third PCB 872. As illustrated, the first story 850 may include some components of the charging circuit (e.g., the switches 814, the inductors 816, and the diodes 818), the second story 860 may include other components of the charging circuit (e.g., the energy storage devices 812), and the third story 870 may include the light emitters 822.

It is understood that the arrangement of three surfaces across three PCBs is provided solely as an example and that other embodiments are possible and are contemplated herein. For example, in various embodiments, there may be greater than or fewer than three stories, greater than or fewer than three surfaces, and/or greater than or fewer than three PCBs. Additionally or alternatively, the components disposed in various stories could be interchanged (e.g., the inductors 816 may be disposed in the second story 860 on a surface of the second PCB 862 rather than in the first story 850 on a surface of the first PCB 852).

Figure 8D:
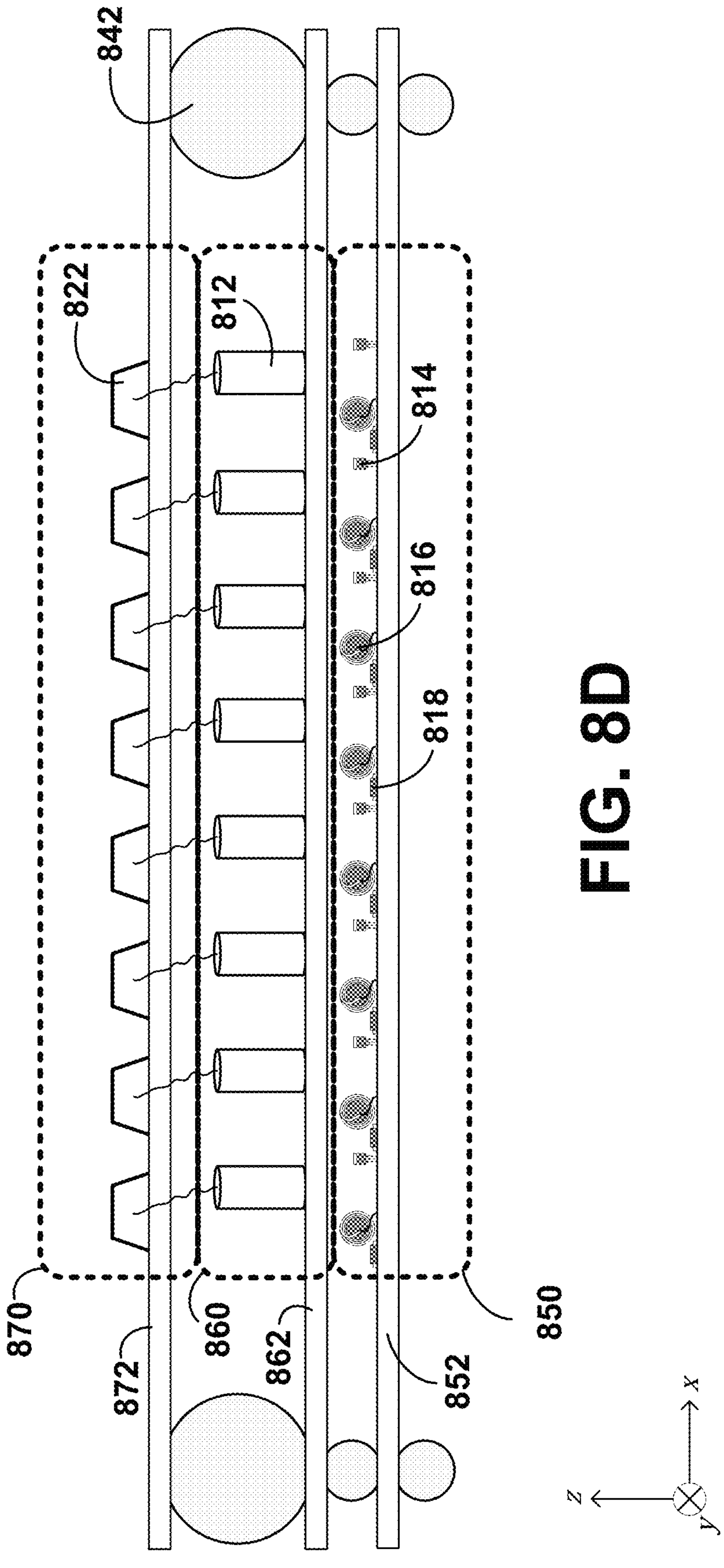
FIG. 8D is a side-view illustration of a charging circuit and associated light emitters, according to example embodiments.

As illustrated in FIG. 8D, the surface of the first PCB 852, the surface of the second PCB 862, and the surface of the third PCB 872 (corresponding to the first story 850, the second story 860, and the third story 870, respectively) may be approximately parallel with one another (e.g., and approximately parallel with the x-y plane, as illustrated) and stacked vertically above one another. Further, the various PCBs 852, 862, 872 may be attached to one another using balls 842 (e.g., solder balls of a BGA). As illustrated, there may be one or more balls 842 attached to a bottom side of the first PCB 852 (e.g., such that the bottom side of the first PCB 852 could be readily attachable to one or more additional PCBs. As further illustrated, the balls 842 may be differently sized in different stories so as to provide differences in height among the stories (e.g., the second story 860 in FIG. 8D is greater in dimension along the z direction than the first story 850). Additionally or alternatively, an adhesive (e.g., glue) may be used to attach two or more of the PCBs 852, 862, 872 together. Electrical connections may be made between the stories through the balls 842, through wirebonds, through vias, through wire traces, etc. Further, electrical connections can be made between components on adjacent stories (e.g., between the first story 850 and the second story 860) or non-adjacent stories (e.g., between the first story 850 and the third story 870). For example, a wirebond could be used to connect a component of the charging circuit on the first PCB 852 with a light emitter 822 on the third PCB 872.

Figure 8E:
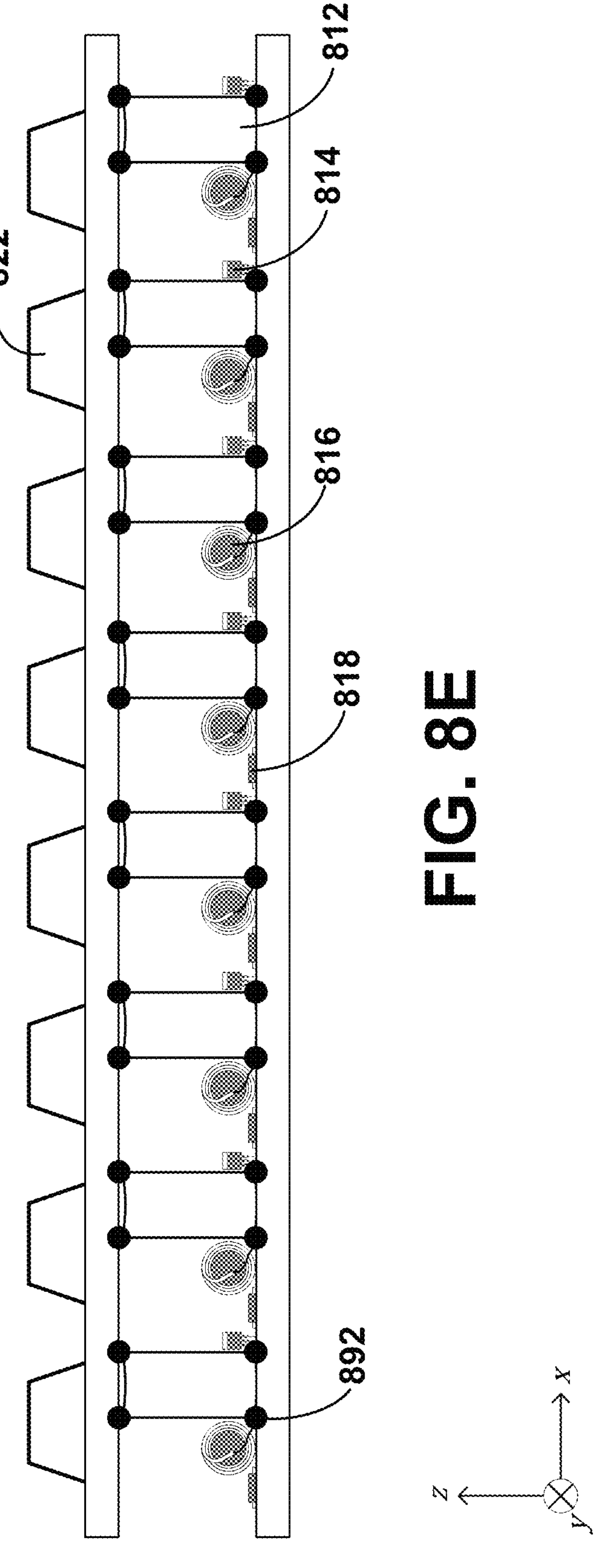
FIG. 8E is a side-view illustration of a charging circuit and associated light emitters, according to example embodiments.

In still other embodiments, the charging circuit and/or the light emitters 822 could be interconnected across multiple PCB surfaces using the soldered connections to one or more of components themselves. For example, FIG. 8E illustrates an arrangement of a charging circuit (e.g., including energy storage devices 812, switches 814, inductors 816, and diodes 818) and light emitters 822. As illustrated, the components of the charging circuit may be positioned on one PCB while the light emitters 822 are positioned on another PCB. Further, the two PCBs may be flip-chip bonded to one another. For example, the flip-chip bond may be formed, at least in part, due to soldered connections 892. At least one of the soldered connections 892 may be between the first side of an SMT component (e.g., the energy storage device 812, as illustrated) and the first PCB. Additionally, at least another of the soldered connections 892 may be between the second side of the same SMT component (e.g., the energy storage device 812, as illustrated) and the second PCB. In addition to attaching the PCB surfaces mechanically, the soldered connections 892 may be used to interconnect components of the PCBs together electrically.

Figures 8F, 8G:
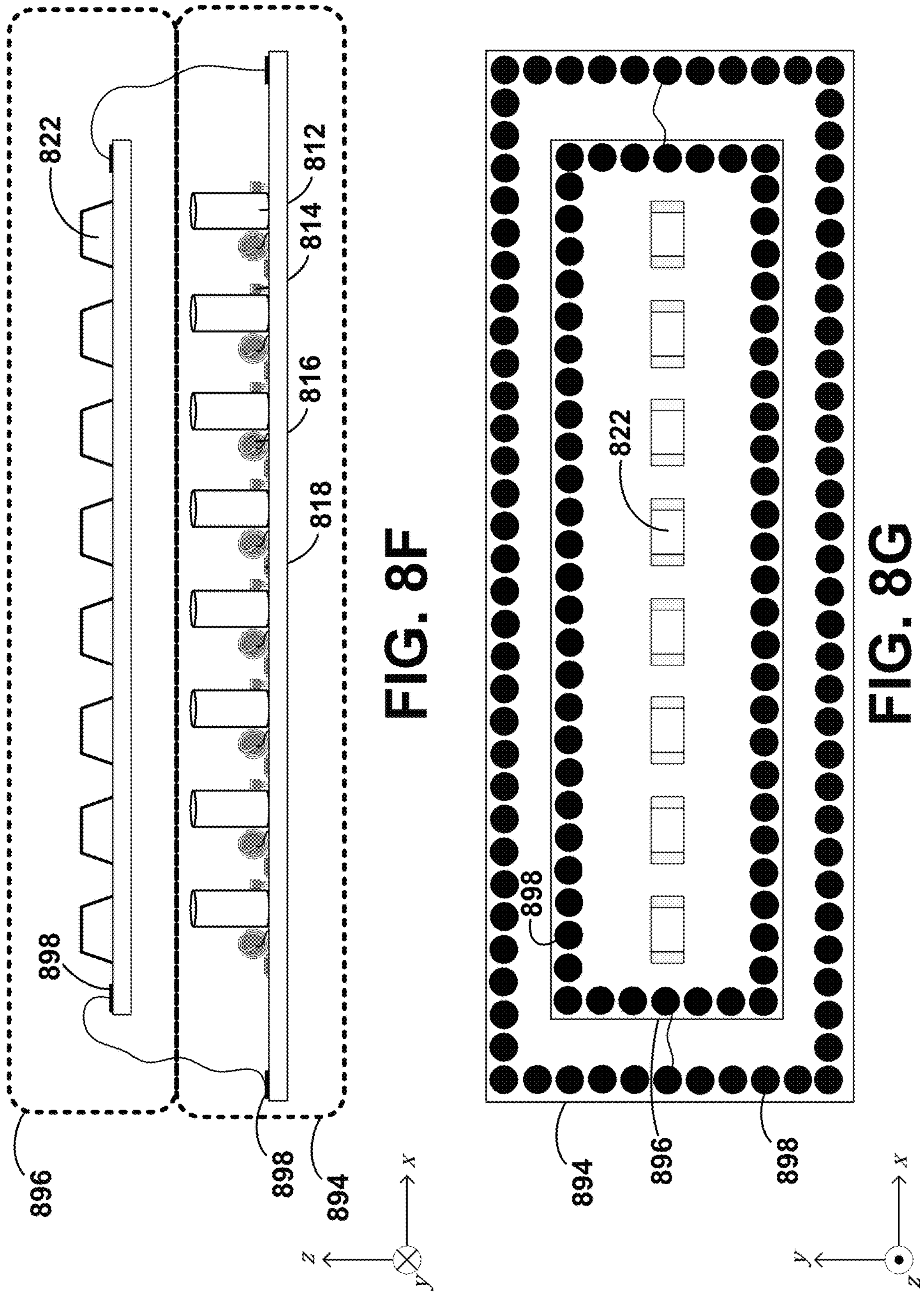
FIG. 8F is a side-view illustration of a charging circuit and associated light emitters, according to example embodiments.
FIG. 8G is a top-view illustration of a charging circuit and associated light emitters, according to example embodiments.

In other embodiments, one or more of the PCB surfaces on which components are attached may be a different size (e.g., different surface area) than one or more other PCB surfaces. For example, FIGS. 8F and 8G illustrate a side view and a top view, respectively, of an arrangement having a first story 894 on the surface of a first PCB and a second story 896 on the surface of the second PCB. The two PCBs may be attached to one another using any of the techniques described above (e.g., adhesive and BGA). As illustrated, the surface of the first PCB corresponding to the first story 894 has a greater surface area (e.g., the area of the planar surface of the PCB that is parallel to the x-y plane) than the surface of the second PCB corresponding to the second story 896.

Either the first story 894, the second story 896, or both may include metallic contacts 898. The metallic contacts 898 may be used to electrically interconnect components from the first story 894 with components of the second story 896. For example, as illustrated in FIG. 8F, wirebonds may be formed between a metallic contact 898 of the first story 894 and a metallic contact 898 of the second story 896. Additionally, the metallic contacts 898 may be interconnected to components on the respective PCB surfaces using wire traces in the PCB surfaces (e.g., a metallic contact 898 in the first story 894 may be connected to an energy storage device 812 in the first story 894 using a wire trace). It is understood that these techniques could be combined with other techniques (e.g., vias through one or more PCBs) to electrically interconnect components (e.g., of the charging circuit with one another).

Figure 9:
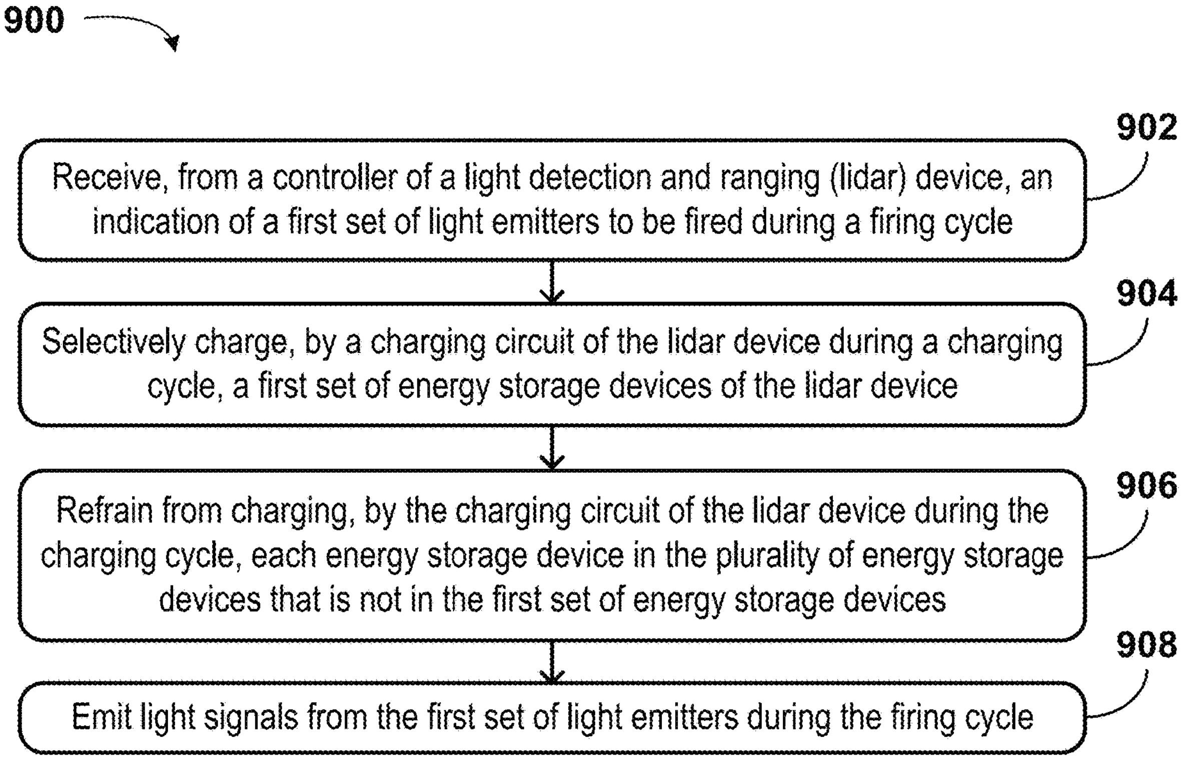
FIG. 9 is a flowchart illustration of a method, according to example embodiments.

FIG. 9 is a flowchart diagram of a method 900, according to example embodiments. In some embodiments, the method 900 may be performed by a firing circuit and light emitters (e.g., the firing circuit 428 and light emitters 424 as shown and described with reference to FIGS. 4B-7). The method 900 may be performed to cause the light emitters 424 to emit light signals into a surrounding environment. Further, the method 900 may be performed at regular intervals (e.g., every 0.5 μs, every 1.0 μs, every 2.0 μs, every 3.0 μs, every 4.0 μs, every 5.0 μs, every 10.0 μs, every 25.0 μs, every 50.0 μs, every 100.0 μs, every 200.0 μs, every 300.0 μs, every 400.0 μs, every 500.0 μs, every 1.0 ms, every 2.0 ms, every 3.0 ms, every 4.0 ms, every 5.0 ms, and every 10.0 ms) in order to emit a series of light signals into a surrounding environment.

At block 902, the method 900 may include receiving, from a controller of a lidar device, an indication of a first set of light emitters to be fired during a firing cycle. The first set of light emitters may be a subset of a plurality of light emitters of the lidar device such that the plurality of light emitters includes one or more light emitters that are not in the first set of light emitters.

At block 904, the method 900 may include selectively charging, by a charging circuit of the lidar device during a charging cycle, a first set of energy storage devices of the lidar device. The first set of energy storage devices may be a subset of a plurality of energy storage devices of the lidar device such that the plurality of energy storage devices includes one or more energy storage devices that are not in the first set of energy storage devices. Each energy storage device of the first set of energy storage devices may be associated with a light emitter in the first set of light emitters.

At block 906, the method 900 may include refraining from charging, by the charging circuit of the lidar device during the charging cycle, each energy storage device in the plurality of energy storage devices that is not in the first set of energy storage devices.

At block 908, the method 900 may include emitting light signals from the first set of light emitters during the firing cycle. Emitting light signals from the first set of light emitters during the firing cycle may include discharging, by a pulser circuit, energy stored within each of the energy storage devices in the first set of energy storage devices through the associated light emitter in the first set of light emitters.

In some embodiments of the method 900, the indication of the first set of light emitters to be fired during the first firing cycle may be received from the controller of the lidar device at a serial peripheral interface (SPI) of the charging circuit.

In some embodiments of the method 900, the indication of the first set of light emitters to be fired during the firing cycle may be received from the controller of the lidar device by a processor of the charging circuit.

In some embodiments of the method 900, the processor of the charging circuit may include a field-programmable gate array (FPGA).

In some embodiments of the method 900, the lidar device may include an application-specific integrated circuit (ASIC). The charging circuit may be a component of the ASIC.

In some embodiments of the method 900, the lidar device may include a CPU, a GPU, or a TPU.

In some embodiments of the method 900, the charging circuit may be arranged on a mounting surface of a printed circuit board (PCB).

In some embodiments of the method 900, the PCB may have a three-dimensional structure. The three-dimensional structure may include a bend in the PCB along an axis that is perpendicular to the mounting surface of the PCB.

In some embodiments of the method 900, the charging circuit may be arranged across a plurality of printed circuit board (PCB) surfaces.

In some embodiments of the method 900, the charging circuit may be arranged across a first PCB surface and a second PCB surface. The first PCB surface may be located within a recession formed within a PCB. Additionally, the second PCB surface may be located outside of the recession formed within the PCB. Further, components of the charging circuit may be electrically interconnected between the first PCB surface and the second PCB surface using wirebonds on the first PCB surface or the second PCB surface and vias through the PCB.

In some embodiments of the method 900, the charging circuit may be arranged across a first PCB surface and a second PCB surface. The first PCB surface may be located on a first PCB. The second PCB surface may be located on a second PCB. The first PCB may be arranged relative to the second PCB such that: (i) the first PCB surface is approximately parallel with the second PCB surface and (ii) the first PCB surface is stacked vertically above the second PCB surface.

In some embodiments of the method 900, the first PCB may be flip-chip bonded to the second PCB. The flip-chip bond may include soldered connections (i) between a first side of a surface-mount technology (SMT) component and the first PCB surface and (ii) between a second side of the SMT component and the second PCB surface. Components of the charging circuit may be electrically interconnected between the first PCB surface and the second PCB surface through the soldered connections.

In some embodiments of the method 900, the second PCB surface may have a greater surface area than the first PCB surface. The second PCB surface may include metallic contacts. Components of the charging circuit may be electrically interconnected between the first PCB surface and the second PCB surface through wirebond connections between (i) the first PCB surface or components of the charging circuit located on the first PCB surface and (ii) the metallic contacts.

In some embodiments of the method 900, the plurality of light emitters may include a group of four light emitters. The plurality of energy storage devices may include a group of four energy storage devices. Further, blocks 904 and 906 may include supplying, when the indication of the first set of light emitters to be fired during the firing cycle includes at least one light emitter in the group of four light emitters, a sufficient voltage to charge each of the energy storage devices in the group of four energy storage devices at respective nodes within the charging circuit that are associated with each of the energy storage devices in the group of four energy storage devices. Additionally, blocks 904 and 906 may also include deactivating, if one or more light emitters in the group of four light emitters are not included in the indication of the first set of light emitters to be fired during the firing cycle, the one or more respective nodes associated with the one or more light emitters in the group of four light emitters that are not included in the indication of the first set of light emitters to be fired during the firing cycle. The deactivation of each respective node may be performed by a respective switching component of the charging circuit.

In some embodiments of the method 900, blocks 904 and 906 may include supplying a sufficient voltage to charge each of the energy storage devices in the first set of energy storage devices at respective nodes within the charging circuit that are associated with each of the energy storage devices. Supplying the sufficient voltage to the respective nodes may include connecting each of the respective nodes to a respective voltage supply using a respective switching component of the charging circuit. In some embodiments of the method 900, during blocks 904 and 906, each of the energy storage devices that is not in the first set of energy storage devices at respective nodes within the charging circuit that are associated with each of the energy storage devices may not be supplied with the sufficient voltage to be charged. This may include disconnecting each of the respective nodes from a respective voltage supply using a respective switching component of the charging circuit.

In some embodiments of the method 900, the charging circuit may include an array of high-side switches. Each of the respective switching components may be a component of the array of high-side switches.

In some embodiments of the method 900, the array of high-side switches may be a component of a serial-controlled solenoid driver (e.g., a multi-channel serial-controlled solenoid driver, such as an eight-channel serial-controlled solenoid driver).

In some embodiments of the method 900, at least one of the plurality of energy storage devices of the lidar device may include a capacitor fabricated from silicon.

In some embodiments of the method 900, the pulser circuit may include one or more gallium nitride field-effect transistors (GaNFETs). The plurality of light emitters may include one or more laser diodes.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the message flow diagrams, scenarios, and flow charts in the figures and as discussed herein, each step, block, operation, and/or communication can represent a processing of information and/or a transmission of information in accordance with example embodiments. Alternative embodiments are included within the scope of these example embodiments. In these alternative embodiments, for example, operations described as steps, blocks, transmissions, communications, requests, responses, and/or messages can be executed out of order from that shown or discussed, including substantially concurrently or in reverse order, depending on the functionality involved. Further, more or fewer blocks and/or operations can be used with any of the message flow diagrams, scenarios, and flow charts discussed herein, and these message flow diagrams, scenarios, and flow charts can be combined with one another, in part or in whole.

A step, block, or operation that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical operations or actions in the method or technique. The program code and/or related data can be stored on any type of computer-readable medium such as a storage device including RAM, a disk drive, a solid state drive, or another storage medium.

Moreover, a step, block, or operation that represents one or more information transmissions can correspond to information transmissions between software and/or hardware modules in the same physical device. However, other information transmissions can be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A method comprising:

receiving, from a controller of a light detection and ranging (lidar) device, an indication of a first set of light emitters to be fired during a firing cycle, wherein the first set of light emitters is a subset of a plurality of light emitters of the lidar device such that the plurality of light emitters includes one or more light emitters that are not in the first set of light emitters;

selectively charging, by a charging circuit of the lidar device during a charging cycle, a first set of energy storage devices of the lidar device, wherein the first set of energy storage devices is a subset of a plurality of energy storage devices of the lidar device such that the plurality of energy storage devices includes one or more energy storage devices that are not in the first set of energy storage devices, wherein each energy storage device of the first set of energy storage devices is associated with a light emitter in the first set of light emitters, wherein the charging circuit is arranged across a first printed circuit board (PCB) surface and a second PCB surface, wherein the first PCB surface and the second PCB surface are different surfaces of a single PCB, wherein the first PCB surface is located within a recession formed within the single PCB, and wherein the second PCB surface is located outside of the recession formed within the single PCB;

refraining from charging, by the charging circuit of the lidar device during the charging cycle, each energy storage device in the plurality of energy storage devices that is not in the first set of energy storage devices; and emitting light signals from the first set of light emitters during the firing cycle, wherein emitting light signals from the first set of light emitters during the firing cycle comprises discharging, by a pulser circuit, energy stored within each of the energy storage devices in the first set of energy storage devices through the associated light emitter in the first set of light emitters.

2. The method of claim 1, wherein the indication of the first set of light emitters to be fired during the first firing cycle is received from the controller of the lidar device at a serial peripheral interface (SPI) of the charging circuit.

3. The method of claim 1, wherein the indication of the first set of light emitters to be fired during the firing cycle is received from the controller of the lidar device by a processor of the charging circuit.

4. The method of claim 3, wherein the processor of the charging circuit comprises a field-programmable gate array (FPGA).

5. The method of claim 1, wherein the lidar device comprises an application-specific integrated circuit (ASIC), and wherein the charging circuit is a component of the ASIC.

6. The method of claim 1, wherein the recession formed within the single PCB is a cavity.

7. The method of claim 1, wherein the recession formed within the single PCB is defined within the single PCB using additive or subtractive technologies.

8. The method of claim 1, wherein the first set of light emitters is arranged on the second PCB surface.

9. The method of claim 1, wherein components of the charging circuit are electrically interconnected between the first PCB surface and the second PCB surface using wire-bonds on the first PCB surface or the second PCB surface and vias through the single PCB.

10. The method of claim 1, wherein the first PCB surface is approximately parallel with the second PCB surface.

11. The method of claim 1, wherein components of the charging circuit are electrically interconnected between the first PCB surface and the second PCB surface using soldered connections.

12. The method of claim 1, wherein the second PCB surface has a greater surface area than the first PCB surface.

13. The method of claim 1, wherein the plurality of light emitters comprises a group of four light emitters, wherein the plurality of energy storage devices comprises a group of four energy storage devices, and wherein selectively charging the first set of energy storage devices and refraining from charging each energy storage device in the plurality of energy storage devices that is not in the first set of energy storage devices comprises:

supplying, when the indication of the first set of light emitters to be fired during the firing cycle includes at least one light emitter in the group of four light emitters, a sufficient voltage to charge each of the energy storage devices in the group of four energy storage devices at respective nodes within the charging circuit that are associated with each of the energy storage devices in the group of four energy storage devices; and deactivating, if one or more light emitters in the group of four light emitters are not included in the indication of the first set of light emitters to be fired during the firing cycle, the one or more respective nodes associated with the one or more light emitters in the group of four light emitters that are not included in the indication of the first set of light emitters to be fired during the firing cycle, wherein the deactivation of each respective node is performed by a respective switching component of the charging circuit.

14. The method of claim 1, wherein selectively charging the first set of energy storage devices and refraining from charging each energy storage device in the plurality of energy storage devices that is not in the first set of energy storage devices comprises:

supplying a sufficient voltage to charge each of the energy storage devices in the first set of energy storage devices at respective nodes within the charging circuit that are associated with each of the energy storage devices, wherein supplying the sufficient voltage to the respective nodes comprises connecting each of the respective nodes to a respective voltage supply using a respective switching component of the charging circuit; and refraining from supplying the sufficient voltage to charge each of the energy storage devices that is not in the first set of energy storage devices at respective nodes within the charging circuit that are associated with each of the energy storage devices, wherein refraining from supplying the sufficient voltage to the respective nodes comprises disconnecting each of the respective nodes from a respective voltage supply using a respective switching component of the charging circuit.

15. The method of claim 14, wherein the charging circuit comprises an array of high-side switches, and wherein each of the respective switching components is a component of the array of high-side switches.

16. The method of claim 15, wherein the array of high-side switches is a component of a serial-controlled solenoid driver.

17. The method of claim 1, wherein at least one of the plurality of energy storage devices of the lidar device comprises a capacitor fabricated from silicon.

18. The method of claim 1, wherein the pulser circuit comprises one or more gallium nitride field-effect transistors (GaNFETs), and wherein the plurality of light emitters comprises one or more laser diodes.

19. A light detection and ranging (lidar) device comprising:

a controller;

a plurality of light emitters;

a charging circuit comprising a plurality of energy storage devices; and a pulser circuit, wherein the charging circuit is configured to receive an indication of a first set of light emitters to be fired during a firing cycle, wherein the first set of light emitters is a subset of the plurality of light emitters such that the plurality of light emitters includes one or more light emitters that are not in the first set of light emitters, wherein the charging circuit is configured to selectively charge, during a charging cycle, a first set of energy storage devices, wherein the first set of energy storage devices is a subset of the plurality of energy storage devices such that the plurality of energy storage devices includes one or more energy storage devices that are not in the first set of energy storage devices, wherein each energy storage device of the first set of energy storage devices is associated with a light emitter in the first set of light emitters, wherein the charging circuit is arranged across a first printed circuit board (PCB surface and a second PCB surface, wherein the first PCB surface and the second PCB surface are different surfaces of a single PCB, wherein the first PCB surface is located within a recession formed within the single PCB, wherein the second PCB surface is located outside of the recession formed within the single PCB, wherein the charging circuit is configured to refrain from charging, during the charging cycle, each energy storage device in the plurality of energy storage devices that is not in the first set of energy storage devices, and wherein the pulser circuit is configured to discharge energy stored within each of the energy storage devices in the first set of energy storage devices through the associated light emitter in the first set of light emitters in order to cause the first set of light emitters to emit light signals during the firing cycle.

20. A light detection and ranging (lidar) device comprising:

a controller;

a plurality of light emitters;

a charging circuit comprising a plurality of energy storage devices;

a pulser circuit, wherein the charging circuit is configured to receive an indication of a first set of light emitters to be fired during a firing cycle, wherein the first set of light emitters is a subset of the plurality of light emitters such that the plurality of light emitters includes one or more light emitters that are not in the first set of light emitters, wherein the charging circuit is configured to selectively charge, during a charging cycle, a first set of energy storage devices, wherein the first set of energy storage devices is a subset of the plurality of energy storage devices such that the plurality of energy storage devices includes one or more energy storage devices that are not in the first set of energy storage devices, wherein each energy storage device of the first set of energy storage devices is associated with a light emitter in the first set of light emitters, wherein the charging circuit is arranged across a first printed circuit board (PCB) surface and a second PCB surface, wherein the first PCB surface and the second PCB surface are different surfaces of a single PCB, wherein the first PCB surface is located within a recession formed within the single PCB, wherein the second PCB surface is located outside of the recession formed within the single PCB, wherein the charging circuit is configured to refrain from charging, during the charging cycle, each energy storage device in the plurality of energy storage devices that is not in the first set of energy storage devices, and wherein the pulser circuit is configured to discharge energy stored within each of the energy storage devices in the first set of energy storage devices through the associated light emitter in the first set of light emitters in order to cause the first set of light emitters to emit light signals during the firing cycle; and a plurality of light detectors configured to detect reflections of the light signals emitted by the first set of light emitters during the firing cycle.

* * * * *